(12) United States Patent
Yamanaka et al.

(10) Patent No.: US 9,511,993 B2
(45) Date of Patent: Dec. 6, 2016

(54) SEMICONDUCTOR PHYSICAL QUANTITY DETECTING SENSOR

(75) Inventors: Kiyoko Yamanaka, Tokyo (JP); Heewon Jeong, Tokyo (JP); Chisaki Takubo, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 587 days.

(21) Appl. No.: 13/983,775

(22) PCT Filed: Jan. 18, 2012

(86) PCT No.: PCT/JP2012/050895
§ 371 (c)(1),
(2), (4) Date: Aug. 6, 2013

(87) PCT Pub. No.: WO2012/124366
PCT Pub. Date: Sep. 20, 2012

(65) Prior Publication Data
US 2013/0346015 A1 Dec. 26, 2013

(30) Foreign Application Priority Data
Mar. 17, 2011 (JP) ................................ 2011-059459

(51) Int. Cl.
*B81B 7/02* (2006.01)
*G01C 19/5747* (2012.01)
(Continued)

(52) U.S. Cl.
CPC .............. *B81B 7/02* (2013.01); *G01C 19/5747* (2013.01); *G01C 19/5769* (2013.01); *G01P 15/125* (2013.01); *G01P 15/18* (2013.01); *G01P 2015/0822* (2013.01)

(58) Field of Classification Search
CPC .......... G01C 19/5712; G01C 19/5747; G01P 15/09; G01P 15/125; G01P 15/131–15/133; B81B 7/02; B81B 7/0235; B81B 7/0285
USPC ................ 702/141, 158, 162, 166, 170, 173
See application file for complete search history.

(56) References Cited

U.S. PATENT DOCUMENTS 5,440,501 A * 8/1995 Shimomura ......... G01D 5/2415
324/662
2006/0057758 A1 3/2006 Yokoyama
(Continued)

FOREIGN PATENT DOCUMENTS

JP 2007-46927 A 2/2007
JP 2010-112930 A 5/2010
(Continued)

OTHER PUBLICATIONS

International Search Report dated Apr. 24, 2012 with English translation (Three (3) pages).

*Primary Examiner* — John Breene
*Assistant Examiner* — Lynda Dinh
(74) *Attorney, Agent, or Firm* — Crowell & Moring LLP

(57) ABSTRACT

A semiconductor physical quantity detection sensor includes (1) a first electrostatic capacitance formed by the movable electrode, and a first fixed electrode formed in a first conductive layer shared with the movable electrode, (2) a second electrostatic capacitance that is formed by the movable electrode, and a second fixed electrode formed in a second conductive layer different in a height from a substrate surface from the movable electrode, and (3) an arithmetic circuit that calculates the physical quantity on the basis of a change in the first and second electrostatic capacitances generated when the physical quantity is applied. In this configuration, an electric signal from the first electrostatic capacitance, and an electric signal from the second electrostatic capacitance are input to the arithmetic circuit.

8 Claims, 17 Drawing Sheets

(51) Int. Cl.
  *G01C 19/5769* (2012.01)
  *G01P 15/125* (2006.01)
  *G01P 15/18* (2013.01)
  *G01P 15/08* (2006.01)

(56) References Cited

U.S. PATENT DOCUMENTS

2008/0030205 A1* 2/2008 Fujii .................. B81B 7/02
                                              324/661

2010/0117167 A1  5/2010  Yokura et al.
2010/0127715 A1  5/2010  Jeong et al.
2011/0115038 A1  5/2011  Kanemoto

FOREIGN PATENT DOCUMENTS

| JP | 2010-127763 A | 6/2010 |
| JP | 2010-127768 A | 6/2010 |
| JP | 4591000 B2 | 12/2010 |
| JP | 2011-128132 A | 6/2011 |

* cited by examiner

FIG. 4
(a)
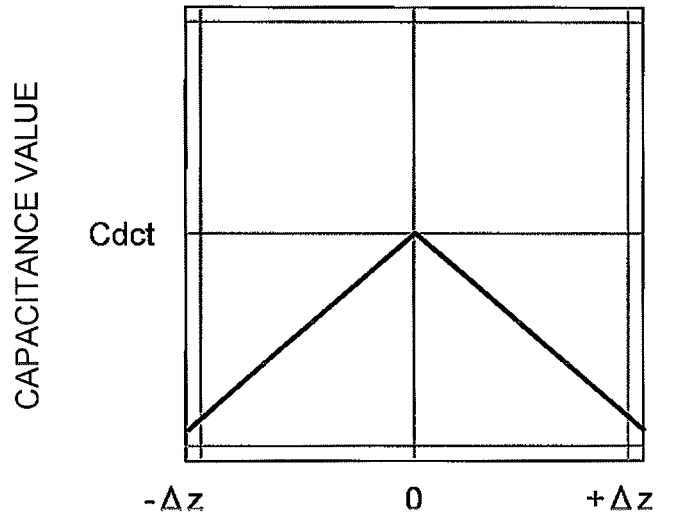
THE AMOUNT OF DISPLACEMENT
(b)
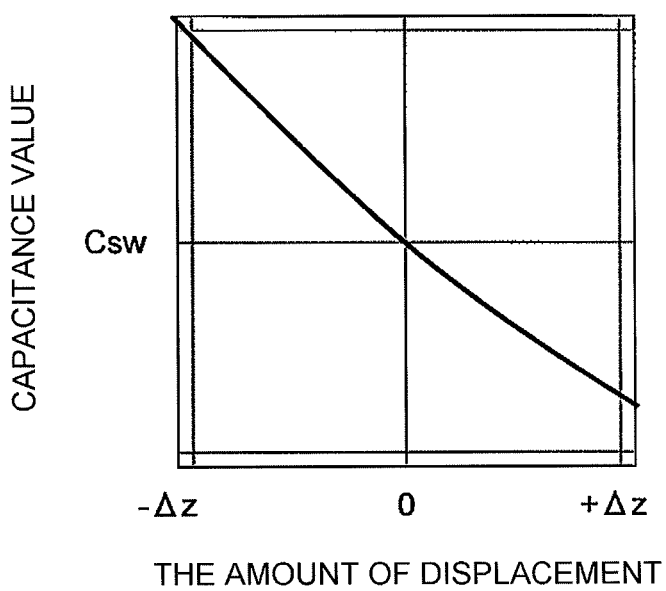
THE AMOUNT OF DISPLACEMENT FIG. 5
(a)
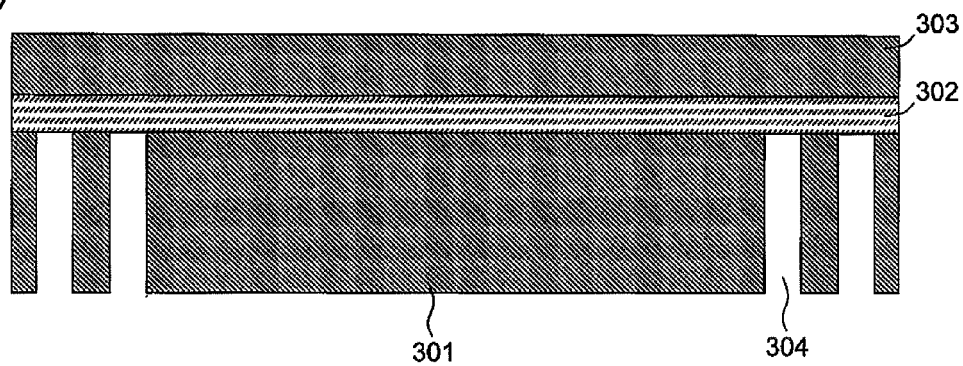
(b)
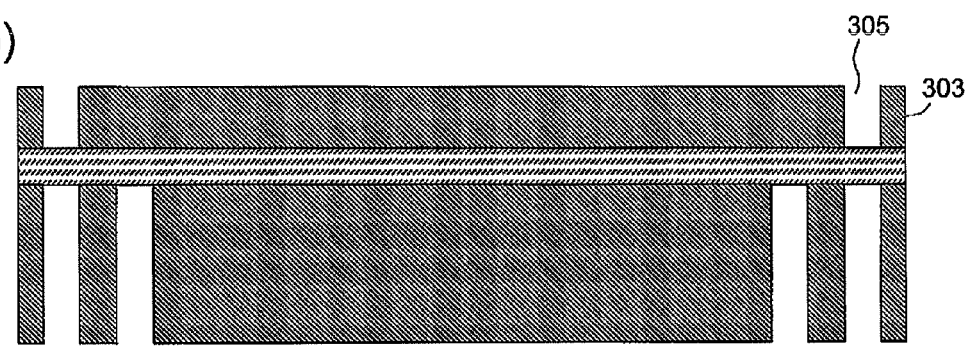
(c)
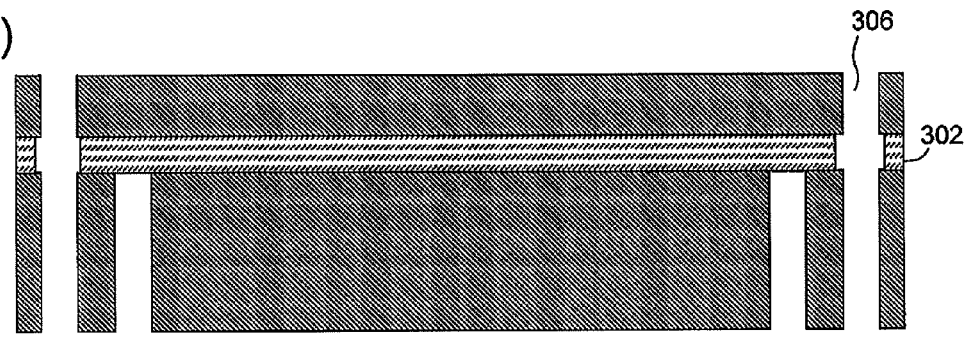

FIG. 6
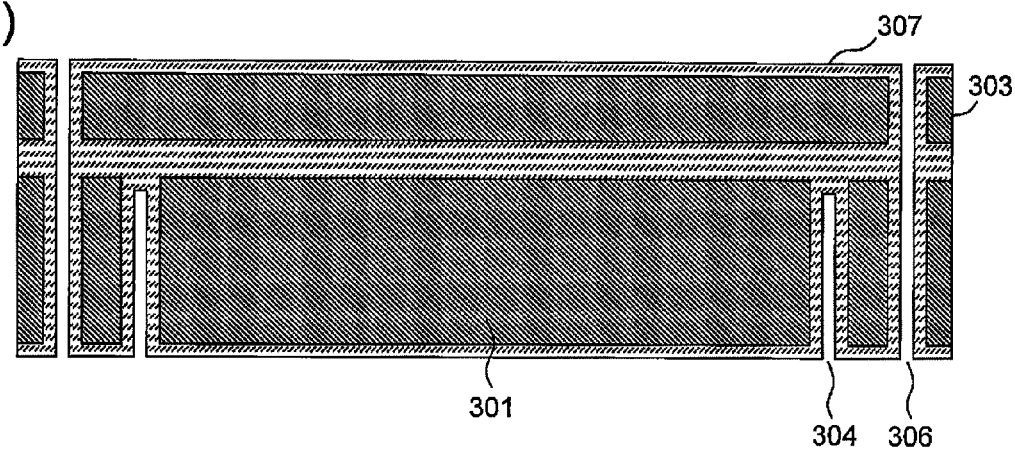
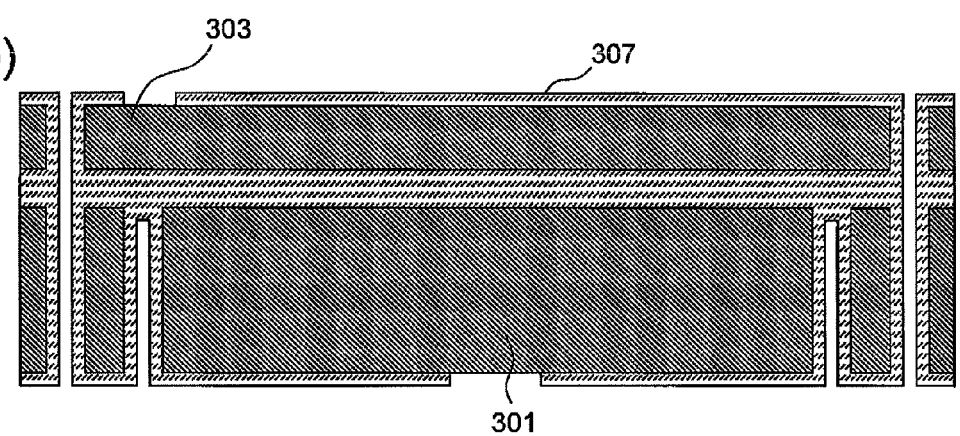
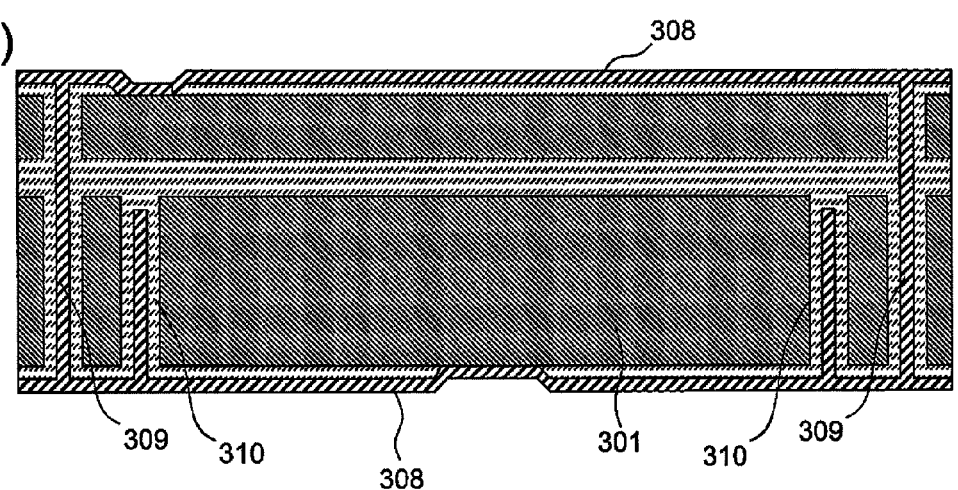

FIG. 10
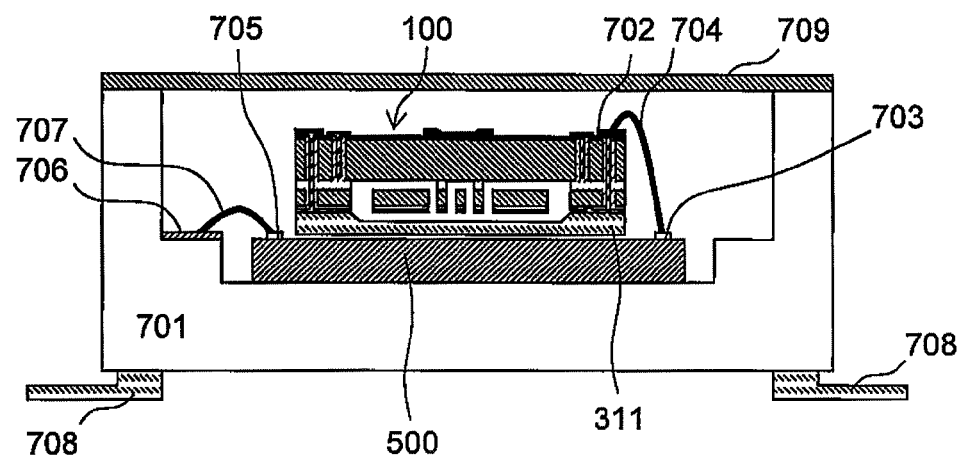
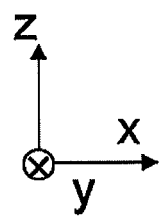

[FIG. 12]

FIG. 14
(a)
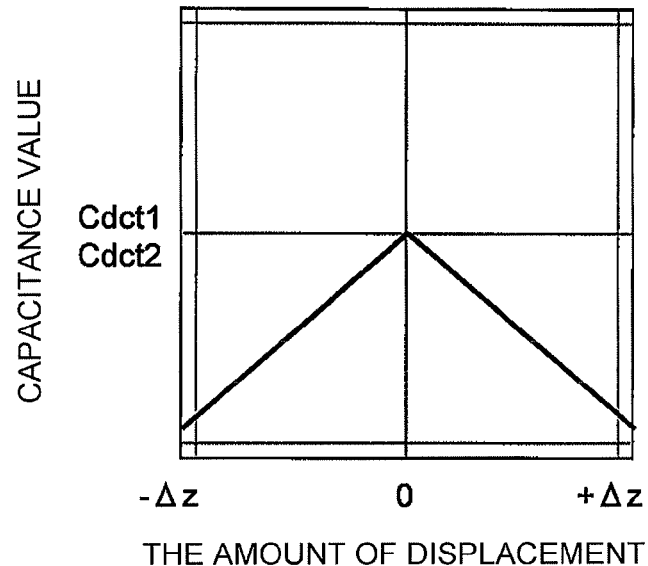
(b)
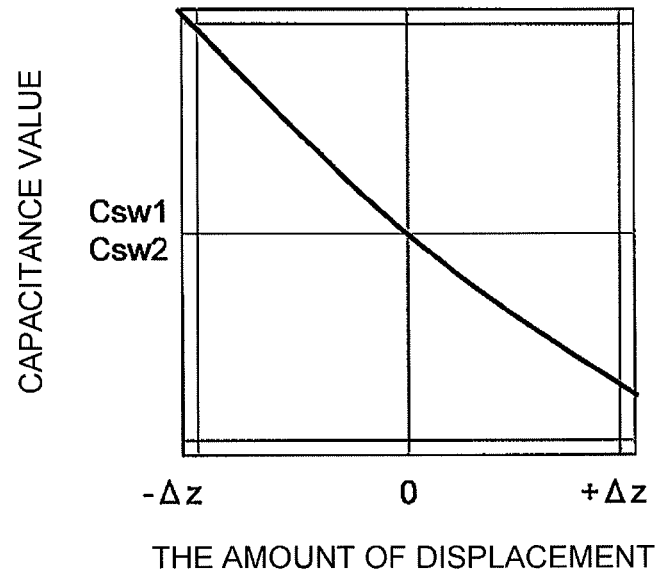

SEMICONDUCTOR PHYSICAL QUANTITY DETECTING SENSOR

CROSS REFERENCE TO RELATED APPLICATIONS

This application is a National Stage of PCT Application No. PCT/JP2012/050895, filed Jan. 18, 2012, which claims priority to Japanese Patent Application No. 2011-059459, filed Mar. 17, 2011, the disclosures of which are expressly incorporated by reference herein.

TECHNICAL FIELD

The present invention relates to a physical quantity detection sensor. For example, the present invention relates to a semiconductor physical quantity detection sensor for detecting a physical quantity attributable to an inertia force (acceleration, angular velocity, etc.) exerted on an object. For example, the present invention relates to a semiconductor physical quantity detection sensor formed with the use of an MEMS (microelectromechanical system: Micro-Electro-Mechanical Systems) technology.

BACKGROUND ART

A semiconductor physical quantity detection sensor using the inertia force includes a movable portion, a support substrate, and a beam portion that couples the movable portion to the support substrate. When a physical quantity is applied to the sensor, the inertia force caused by the physical quantity is exerted on the movable portion, and the movable portion is displaced with respect to the support substrate. With the above displacement, a capacitance value of a capacitor formed by a movable electrode integrated with the movable portion, and a fixed electrode fixed to the support substrate is changed. The physical quantity detection sensor converts the change in the capacitance value into an electric signal, and outputs the electric signal to an arithmetic circuit. The arithmetic circuit executes arithmetic processing for converting the electric signal into the physical quantity applied to the sensor.

There has been known that when a semiconductor chip that operates as the physical quantity detection sensor is formed with the use of the MEMS technology, the movable electrode and the fixed electrode are formed in the same active layer of an SOI (silicon on insulator) wafer. In the sensor of this type, when the physical quantity is applied to the sensor, and the inertia force caused by the physical quantity is exerted on the movable portion, a displacement of the movable portion is generated in a thickness direction of the support substrate.

For example, when the movable portion is displaced in a direction of separating from the support substrate, a facing area of the movable electrode and the fixed electrode is reduced. That is, the capacitance formed by the movable electrode and the fixed electrode is reduced. On the other hand, when the movable portion is displaced in a direction of approaching the support substrate, the facing area of the movable electrode and the fixed electrode is reduced. That is, the capacitance formed by the movable electrode and the fixed electrode is reduced.

That is, in the sensor in which the movable electrode and the fixed electrode are formed in the same layer, and the displacement of the movable portion is generated in the thickness direction of the support substrate, the amount of displacement of the movable portion can be detected according to an increment or decrement of the capacitance value of the capacitance formed by the movable electrode and the fixed electrode. However, whether the direction of displacement is the direction of separating from the support substrate, or the direction of approaching the support substrate, cannot be distinguished by only the increment or decrement of the capacitance formed by the movable electrode and the fixed electrode.

Under the circumstance, a technique of PTL 1 has been proposed as the background art of this technical field. This literature discloses the technique in which a compressive stress layer formed of a thermally-oxidized film, a polycrystal silicon or silicon nitride film is formed on a surface of the beam portion that couples the movable electrode to the support substrate, as a result of which the movable electrode can be warped in a direction of separating the movable electrode from the support substrate even in a state the physical quantity is not applied to the sensor. In the sensor of this type, the movable electrode is warped in the direction of separating the movable electrode from the support substrate even in the state where the physical quantity is not applied to the sensor. Therefore, the direction and amount of displacement of the movable electrode in the thickness direction of the support substrate, that is, the direction and magnitude of the applied dynamic quantity can be appropriately detected.

Also, a technique of PTL 2 has been proposed as the background art of the this technical field. This literature discloses the technique in which a protrusion is disposed on a cap portion (a protective member that prevents water or foreign matter from being mixed into the sensor) which is joined to the sensor, and the sensor movable portion is pushed by the protrusion, as a result of which the movable electrode is moved to the support substrate side even in a state where the physical quantity is not applied to the sensor. In the sensor of this type, because the movable electrode is moved in a direction of approaching the support substrate even in the state where the physical quantity is not supplied to the sensor, the direction and amount of displacement of the movable electrode in the thickness direction of the support substrate, that is, the direction and magnitude of the applied dynamic quantity can be appropriately detected.

Also, a technique of PTL 3 has been proposed as the background art of this technical field. This literature discloses the technique in which a bias voltage is applied between an active layer of an SOI wafer on which the movable electrode and the fixed electrode are formed, and the support substrate, and an electrostatic force is used even in a state in which the physical quantity is not applied to the sensor, to thereby produce different distances of the movable electrode and the fixed electrode with respect to the support substrate. In the sensor of this type, the movable electrode can be moved in the direction of approaching the support substrate even in a state where the physical quantity is not applied to the sensor. For that reason, the direction and amount of displacement of the movable electrode in the thickness direction of the support substrate, that is, the direction and magnitude of the applied dynamic quantity can be appropriately detected.

CITATION LIST

Patent Literature

PTL 1: Japanese Patent No. 4591000
PTL 2: JP-A-2010-112930
PTL 3: JP-A-2010-127768

SUMMARY OF INVENTION

Technical Problem

The conventional art disclosed in PTL 1 conceivably suffers from the following problems.
(1) In order to form the compressive stress layer on the surface of the beam portion, a complicated process is necessary. For that reason, a manufacture unit price is relatively expensive.
(2) In the formation of the thermally-oxidized film, the polycrystal silicon film, or the silicon nitride film, a high-temperature process of several hundreds ° C. to several thousands ° C. is necessary. For that reason, the integration of a capacitance/voltage converter circuit for advancing the performance (for example, an improvement in the detection sensitivity) of the device in the periphery of the fixed electrode and the movable electrode is restricted.
(3) An internal stress of the compressive stress layer is large in temperature characteristic and a change with time. For that reason, there is a risk that the reliability of the sensor becomes low.
(4) The internal stress of the compressive stress layer is large in a variation in the performance of the sensor such as a sensitivity/initial offset of a wafer in-plane caused by the thickness.
(5) The control of the amount of warp by the compressive stress layer is determined according to the process condition. For that reason, the amount of warp cannot be actively controlled, and complicated signal processing is required for correction of the sensor performance.

The conventional art disclosed in PTL 2 conceivably suffers from the following problems.
(1) In order to form the protrusion on the cap portion, the complicated process becomes necessary. For that reason, the manufacture unit price is relatively expensive.
(2) A height of the protrusion formed on the cap portion needs to be set to a size nearly equal to or lower than the amount of variation of the movable portion. For example, when the movable portion is formed with the use of the SOI substrate, a thickness of the BOX oxide film layer corresponding to a movable space becomes about several micrometers. For that reason, the amount of displacement of the movable portion becomes equal to or lower than several micrometers. Also, the height of the protrusion formed on the cap portion becomes several 100 nanometers or lower. Therefore, when the protrusion is formed on a silicon substrate or a glass substrate which is a base material of the cap portion, the protrusion must be processed with a precision of several tens nanometer or lower. However, the processing variation generated among the wafers or within the wafer plane during manufacturing is large, and complicated processing and signal processing are required for correction of the sensor performance.
(3) When a base material is stuck onto a sensor substrate, the protrusion formed on the cap portion needs to match the beam portion that couples the sensor movable portion to the support substrate. For that reason, in a process of sticking the cap base material to the sensor substrate, the positioning precision of several micrometers or lower is necessary, as a result of which there is a possibility that the manufacture yield is deteriorated to raise the chip unit prices.

The conventional art disclosed in PTL 3 conceivably suffers from the following problems.
(1) In this art, the bias voltage is applied between the movable portion and the support substrate to generate a static electricity. For that reason, a nonlinear electrostatic attractive force is exerted between the movable portion and the support substrate with respect to the distance between the movable portion and the support substrate, as represented by Expression 1. In this expression, Fe is the electrostatic attractive force exerted between the movable portion and the support substrate, ε is a permittivity between the movable portion and the support substrate, S is a facing area of the movable portion and the support substrate, V is a applied voltage between the movable portion and the support substrate, and d is a distance between the movable portion and the support substrate.

[Ex. 1]

$$F_c = \frac{\varepsilon S V^2}{2d^2} \qquad \text{(Ex. 1)}$$

The magnitude of the electrostatic attractive force exerted between the movable portion and the support substrate is different between a case in which the movable portion is displaced in the direction of separating from the support substrate, and a case in which the movable portion is displaced in the direction of approaching the support substrate. For that reason, in order to linearly correct the sensor output, the complicated signal processing becomes necessary.

Solution to Problem

In order to solve at least one of those problems, for example, a structure according to claims is applied. That is, the semiconductor physical quantity detection sensor according to the present invention includes a structure described below as a structure that can solve at least one of the above-mentioned problems. The semiconductor physical quantity detection sensor includes: a movable electrode that is displaced by application of a physical quantity; a first electrostatic capacitance that is formed in a first conductive layer shared with the movable electrode; a second electrostatic capacitance that is formed by the movable electrode; and a second fixed electrode formed in a second conductive layer different in a height from a substrate surface from the movable electrode; and an arithmetic circuit that calculates the physical quantity on the basis of a change in the first and second electrostatic capacitances generated when the physical quantity is applied. In this case, an electric signal from the first electrostatic capacitance, and an electric signal from the second electrostatic capacitance are respectively input to the arithmetic circuit.

Advantageous Effects of Invention

The present invention can provide a sensor that can detect a direction and magnitude of the applied dynamic quantity at lower costs.

The other problems, configurations, and advantageous effects will become apparent from the following description of embodiments.

BRIEF DESCRIPTION OF DRAWINGS

FIG. 4 is a diagram illustrating an output characteristic of the acceleration sensor chip according to the first embodiment.

FIG. 5 is a diagram illustrating a part of a process of manufacturing the acceleration sensor chip according to the first embodiment.

FIG. 6 is a diagram illustrating apart of the process of manufacturing the acceleration sensor chip according to the first embodiment.

FIG. 10 is a diagram illustrating a cross-sectional structure in which the acceleration sensor chip is mounted according to the first embodiment.

FIG. 14 is a diagram illustrating an output characteristic of the angular velocity sensor chip according to the second embodiment.

DESCRIPTION OF EMBODIMENTS

Hereinafter, embodiments of the present invention will be described with reference to the drawings. The embodiments of the present invention is not restricted to examples described below, and can be variously modified within a scope of the technical concept.

First Embodiment

In this embodiment, a description will be given of a case in which a physical quantity detection sensor is an acceleration sensor. First, a basic configuration of the acceleration sensor according to this embodiment will be described.

<Configuration of Sensor Configuration and Upper Surface>

Figure 1:
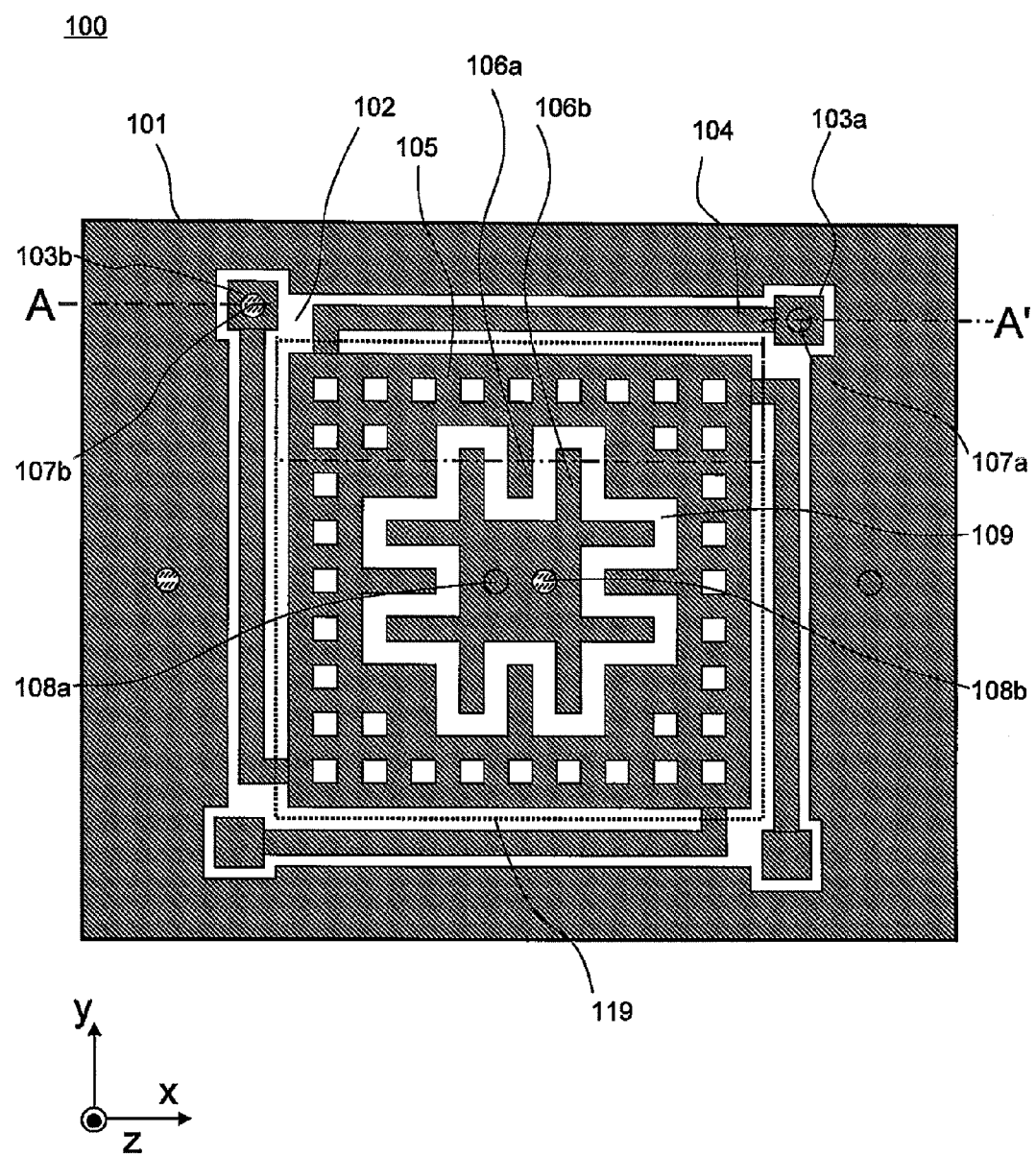
FIG. 1 is a diagram illustrating an upper surface structure of an acceleration sensor chip according to a first embodiment.

FIG. 1 is a top view illustrating a structure configuring an acceleration sensor formed in a sensor chip 100.

As illustrated in FIG. 1, a hollow portion 102 is formed in an inside portion of a frame portion 101 of the sensor chip 100. Fixed portions 103a and 103b are formed in four corners of the hollow portion 102. Each of the fixed portions 103a and 103b is connected with one end of each beam 104 elastically deformed. The other end of the beam 104 is connected to a movable portion 105 which is a weight of the acceleration sensor. That is, the fixed portions 103a and 103b, and the movable portion 105 are coupled with each other through the respective four beams 104 that can be elastically deformed. As will be described later, a space is formed between the beams 104 and a lower portion of the movable portion 105. Therefore, the movable portion 105 is supported by the four beams 104 at the four corners. With this structure, the movable portion 105 can be displaced in a z-direction as shown in FIG. 1 (a direction perpendicular to a paper plane).

A hollow portion 109 is formed further inside of the movable portion 105. That is, the movable portion 105 has a planar structure formed in a substantially annular structure. Detection movable electrodes 106a formed integrally with the movable portion 105 are formed on an inner peripheral portion of the movable portion 105 that faces the hollow portion 109. In this embodiment, the detection movable electrodes 106a are each formed as a convex pattern extending from an inner peripheral side of the movable portion 105 toward a center direction thereof.

A fixed pattern is formed further inside of the hollow portion 109. Detection fixed electrodes 106b are formed in the fixed pattern so as to face the detection movable electrodes 106a with the substantially same height as that of the detection movable electrodes 106a. That is, the detection fixed electrodes 106b are formed in the hollow portion 109. In this embodiment, the detection fixed electrodes 106b are U-shaped so as to substantially surround the detection movable electrodes 106a within the substantially same plane.

In this example, the detection movable electrodes 106a and the detection fixed electrodes 106b form a capacitive element (first electrostatic capacitance) within the same plane. A state in which acceleration is not applied to the detection movable electrodes 106a represents an initial state in the first electrostatic capacitance. A magnitude and orientation of the displacement of the detection movable electrodes 106a when the acceleration is applied in the z-direction are assigned on the basis of the initial state.

When the movable portion 105 is displaced in the z-direction by the acceleration applied from the external, a capacitance of the above-mentioned first electrostatic capacitance is changed. That is, the capacitive element configured by the detection movable electrodes 106a and the detection fixed electrodes 106b functions as a capacitance detection unit that detects the displacement of the movable portion 105 in the z-direction as a change in the capacitance. The first electrostatic capacitance is used for detection of the magnitude of the acceleration.

Also, in this embodiment, the support substrate arranged at a position facing the frame portion 101 in the z-direction is formed with a lower electrode 119 facing the movable portion 105. The lower electrode 119 and the movable portion 105 form a capacitive element (second electrostatic capacitance). A state in which acceleration is not applied to the movable portion 105 represents an initial state in the second electrostatic capacitance. A magnitude and orientation of the displacement of the movable portion 105 when the acceleration is applied in the z-direction are assigned on the basis of the initial state.

When the movable portion 105 is displaced in the z-direction by the acceleration applied from the external, a capacitance of the second electrostatic capacitance is changed. That is, the capacitive element (second electrostatic capacitance) configured by the movable portion 105 and the lower electrode 119 functions as a capacitance detection unit that detects the displacement of the movable portion 105 in the z-direction as a change in the capacitance. The second electrostatic capacitance is used for detection of the direction of the acceleration.

A structure of the acceleration sensor is made of a semiconductor material such as silicon. The fixed portions 103a and 103b, and the movable portion 105 which are connected to each other through the beams 104 are electrically connected to each other. In this embodiment, an applied potential to the movable portion 105 is supplied from a pad 116 (FIG. 2) on a substrate rear surface through a penetration electrode 107a formed in each of the fixed portions 103a. A penetration electrode 107b formed in each of the fixed portions 103b is electrically connected to the frame portion 101 formed of the silicon active layer. A connection by the penetration electrode 107b is intended for reduction of noise.

On the other hand, the fixed pattern in the center of the sensor in which the detection fixed electrodes 106b are formed is formed with a penetration electrode 108a. The penetration electrode 108a is electrically connected to a pad 118 (FIG. 2) on the substrate rear surface so that electric charge can flow in or flow out of the detection fixed electrodes 106b due to a change in the capacitance generated when the movable portion 105 (detection movable electrodes 106a) is displaced in the z-direction. On the other hand, a penetration electrode 108b is intended for applying a common potential. The noise is reduced by application of the common potential.

Figure 2:
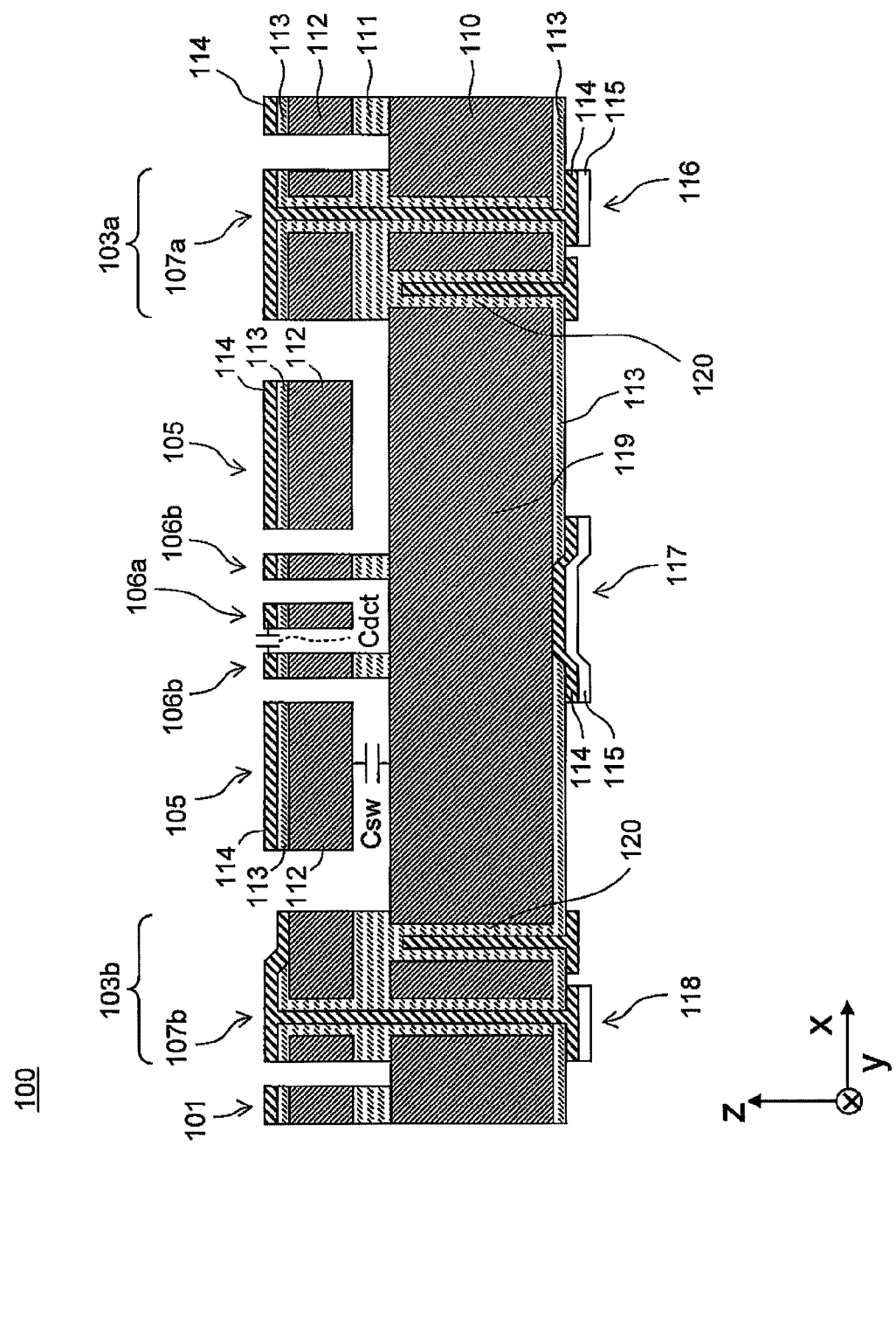
FIG. 2 is a diagram illustrating a cross-sectional structure of the acceleration sensor chip according to the first embodiment.

The penetration electrodes 107a, 107b, 108a, and 108b are each electrically isolated from the other conductive layers through an insulating oxide film layer 111 (FIG. 2) and a dielectric isolation structure 120 (FIG. 2).

<Sensor Configuration and Cross-Section>

FIG. 2 is a cross-sectional view taken along a line A-A' in FIG. 1. The line A-A' passes through the fixed portion 103a, the detection fixed electrode 106b, the detection movable electrode 106a, the detection fixed electrode 106b, and the fixed portion 103b.

As illustrated in FIG. 2, in the sensor chip 100, the insulating oxide film layer 111 is formed on a support substrate 110, and a silicon active layer 112 is further formed on the insulating oxide film layer 111. That is, the sensor chip 100 configuring the acceleration sensor in the first embodiment is formed of an SOI (silicon on insulator) substrate.

Further, a surface of the silicon active layer 112 is formed with an insulating film 113 and a conductive film 114. That is, the fixed portions 103a, the fixed portions 103b, the movable portion 105, the detection movable electrodes 106a, the detection fixed electrodes 106b, and the beams 104 are formed integrally with processing of the SOI substrate, the insulating film 113 formed on a surface of the SOI substrate, and the conductive film 114.

As illustrated in FIG. 2, the fixed portion 103a and the fixed portion 103b are fixed to the support substrate 110 through the insulating oxide film layer 111. Likewise, the detection fixed electrodes 106b formed on an outer edge portion of the fixed pattern are also fixed to the support substrate 110 through the insulating oxide film layer 111.

On the other hand, the movable portion 105 (detection movable electrodes 106a) is formed of the silicon active layer 112, the insulating film 113 formed on a surface of the silicon active layer 112, and the conductive film 114. The insulating oxide film layer 111 that has been formed in a lower portion of the movable portion 105 is removed by processing. In this way, the movable portion 105 is separated from the support substrate 110. Likewise, the insulating oxide film layer 111 which has been formed in a lower portion of the beams 104 not illustrated in FIG. 2 is also removed when processing.

As a result, the movable portion 105 is arranged within the hollow portion 102, and also supported by the beams 104. That is, the movable portion 105 is not completely fixed to the support substrate 110, but formed so as to be displaceable in the z-direction.

Referring to FIG. 2, a displacement detection capacitive element Cdct is configured by the conductive films 114 of the detection movable electrodes 106a and the detection fixed electrodes 106b. On the other hand, an orientation determination capacitive element Csw is configured by the silicon active layer 112 configuring a lower surface of the movable portion 105, and the lower electrode 119 formed in the support substrate 110. A current can flow in or flow out of the lower electrode 119 with respect to a pad 117 on the substrate rear surface.

In this example, the displacement detection capacitive element Cdct corresponds to the above-mentioned first electrostatic capacitance, and the orientation determination capacitive element Csw corresponds to the above-mentioned second electrostatic capacitance. Further, a current path of the displacement detection capacitive element Cdct, and a current path of the orientation determination capacitive element Csw are electrically isolated from each other by the dielectric isolation structure 120 within the support substrate 110.

<Sensor Operation>

Subsequently, a description will be given of a basic operating principle of the acceleration sensor according to the first embodiment.

Figure 3:
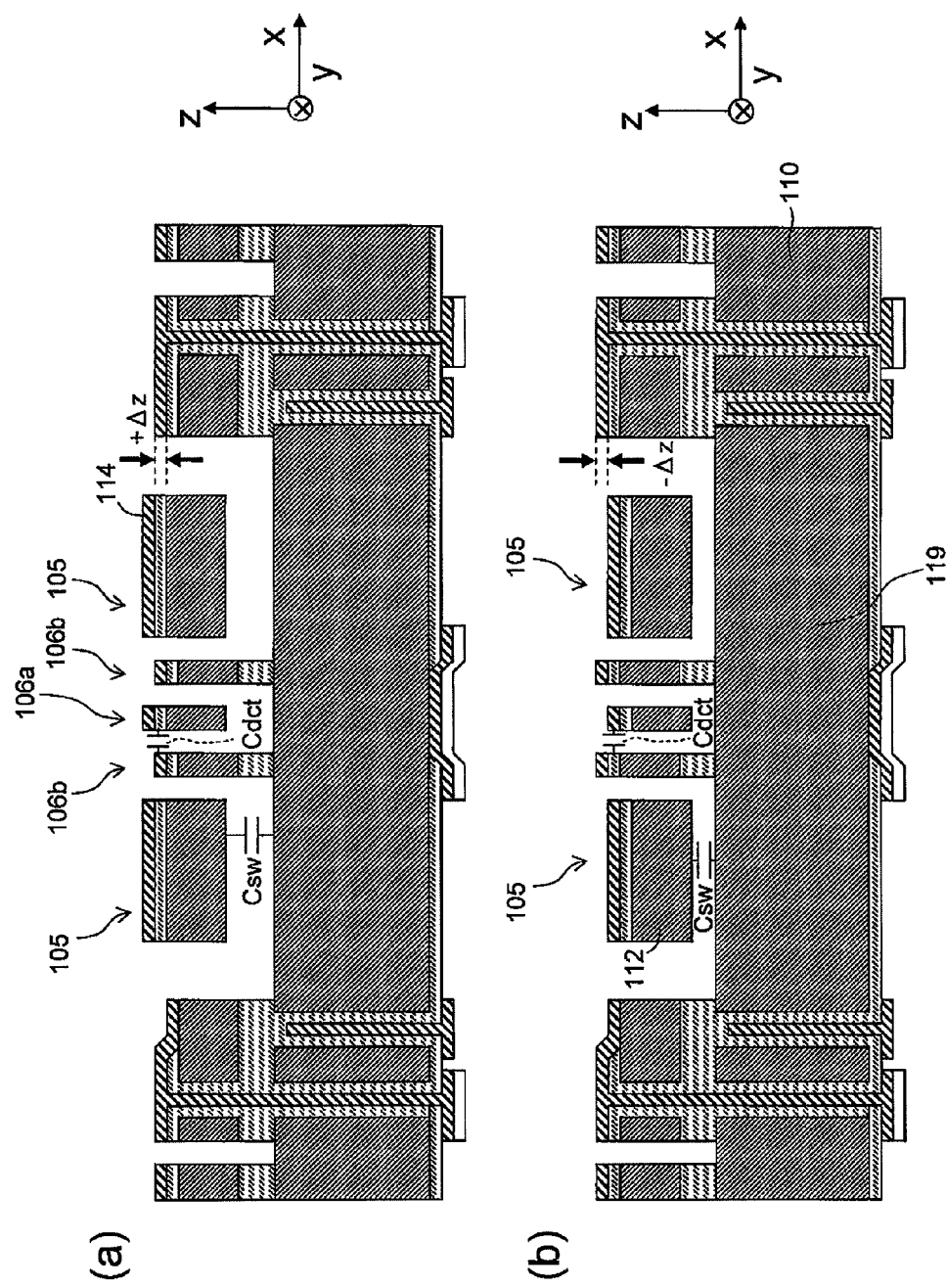
FIG. 3 is a diagram illustrating a cross-sectional structure of the acceleration sensor chip according to the first embodiment.

Cross-sectional views of the acceleration sensor according to the first embodiment taken along a line A-A' in FIG. 1 are illustrated in FIGS. 3(a) and 3(b). FIGS. 3(a) and 3(b) are cross-sectional views in a state where acceleration is applied to the acceleration sensor chip from the external in the z-direction. A cross-sectional view in a state where the acceleration is not applied to the acceleration sensor chip from the external in the z-direction corresponds to FIG. 2.

FIG. 3(a) illustrates a cross-sectional view when the movable portion 105 is displaced from the initial position (position at which the movable portion 105 is located before the acceleration is applied) in a direction (+Δz direction) of separating from the support substrate 110 with respect to the z-direction by the acceleration applied from the external. In this case, the capacitance of the above-mentioned displacement detection capacitive element Cdct (first electrostatic capacitance) is decreased. FIG. 3(b) illustrates a cross-sectional view when the movable portion 105 is displaced from the initial position in a direction (−Δz direction) of approaching the support substrate 110 with respect to the z-direction by the acceleration applied from the external. In this case, the capacitance of the above-mentioned displacement detection capacitive element Cdct (first electrostatic capacitance) is decreased.

In this way, the displacement detection capacitive element Cdct (configured by the conductive layer 114 of the detection movable electrodes 106a and the conductive layer 114 of the detection fixed electrodes 106b) functions as capacitance detection unit that detects the amount of displacement of the movable portion 105 in the z-direction as a change in the capacitance.

On the other hand, as illustrated in FIG. 3(a), when the movable portion 105 is displaced from the initial position in the direction (+Δz direction) of separating from the support substrate 110 with respect to the z-direction by the acceleration applied from the external, the capacitance of the above-described orientation determination capacitive element Csw (second electrostatic capacitance) is decreased. Also, as illustrated in FIG. 3(b), when the movable portion 105 is displaced from the initial position in the direction (−Δz direction) of approaching the support substrate 110 with respect to the z-direction by the acceleration applied from the external, the capacitance of the above-described orientation determination capacitive element Csw (second electrostatic capacitance) is increased.

In this way, the orientation determination capacitive element Csw (configured by the silicon active layer 112, and the lower electrode 119 within the support substrate 110) functions as a capacitance detection unit that detects the direction of displacement of the movable portion 105 in the z-direction as a change in the capacitance.

<Change in Capacitance>

FIG. 4 illustrates an output characteristic of the acceleration sensor chip according to the first embodiment. As illustrated in FIG. 4(a), when the movable portion 105 is displaced in the direction (+Δz direction) of separating from the support substrate 110 with respect to the z-direction by the acceleration applied from the external, the capacitance of the above-described displacement detection capacitive element Cdct (first electrostatic capacitance) is decreased. Also, when the movable portion 105 is displaced in the direction (−Δz direction) of approaching the support substrate 110 with respect to the z-direction by the acceleration applied from the external, the capacitance of the above-described displacement detection capacitive element Cdct is decreased. That is, the displacement detection capacitive element Cdct functions as the capacitance detection unit that detects the amount of displacement of the movable portion in the z-direction as a change in the capacitance.

On the other hand, as illustrated in FIG. 4(b), when the movable portion 105 is displaced in the direction (+Δz direction) of separating from the support substrate 110 with respect to the z-direction by the acceleration applied from the external, the capacitance of the above-described orientation determination capacitive element Csw (second electrostatic capacitance) is decreased. Also, when the movable portion 105 is displaced in the direction (−Δz direction) of approaching the support substrate 110 with respect to the z-direction by the acceleration applied from the external, the capacitance of the above-described orientation determination capacitive element Csw is increased. That is, the orientation determination capacitive element Csw functions as the capacitance detection unit that detects the direction of displacement of the movable portion in the z-direction as a change in the capacitance.

<Manufacturing Process>

Figure 7:
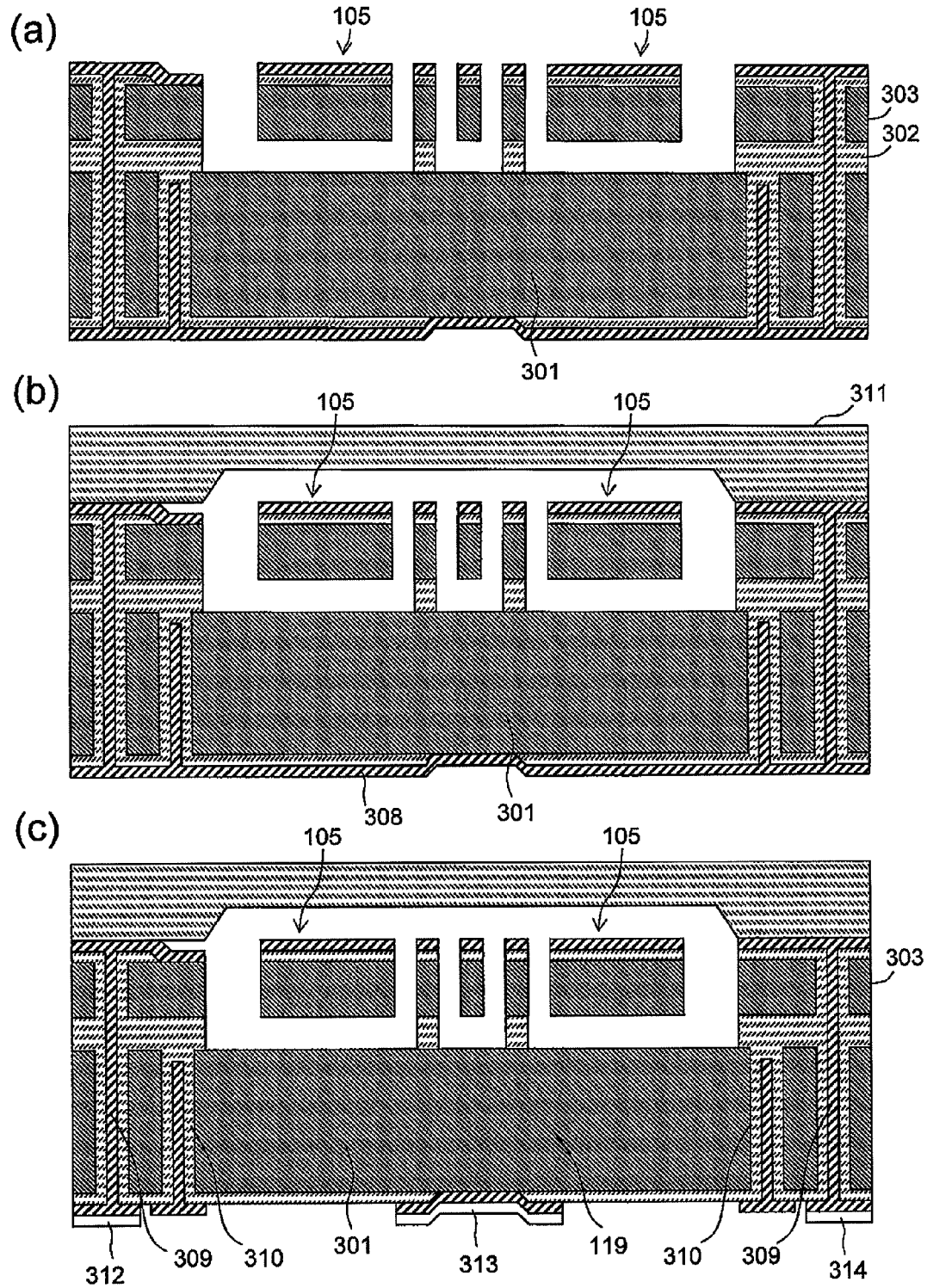
FIG. 7 is a diagram illustrating apart of the process of manufacturing the acceleration sensor chip according to the first embodiment.

Subsequently, a description will be given of a method of manufacturing the acceleration sensor chip according to the first embodiment with reference to FIGS. 5 to 7.

First, an insulating oxide film layer 302 and a silicon active layer 303 are laminated on one surface side of a support substrate 301 in the stated order to form the SOI substrate. Subsequently, the support substrate 301 is processed from an opposite side to a formation surface of the SOI substrate to form through-holes 304 (FIG. 5(a)). A depth etching technique of silicon monocrystal is used in the formation of the through-holes 304.

Then, a through-hole 305 is formed in the silicon active layer 303 from a side of the silicon active layer 303 of the SOI substrate by the depth etching technique of the silicon monocrystal crystal (FIG. 5(b)). In this example, the through-hole 305 is formed at a position facing a part of the through-holes 304 formed in advance through the insulating oxide film layer 302.

Then, a part of the insulating oxide film layer 302 of the SOI substrate is removed through a wet etching method or a gas phase etching to form a through-hole 306 piercing the SOI substrate (FIG. 5(c)). The formed through-hole 306 is finally formed with penetration electrodes 107a, 107b, 108a, and 108b.

Subsequently, an insulating film 307 is formed on surfaces of the processed through-holes 304 and through-hole 306 through a sputtering method or a CVD method to electrically protect the support substrate 301 and the silicon active layer 303 (FIG. 6(a)).

Subsequently, a part of the insulating film 307 is processed through a photolithography and an etching technique so as to expose a part of the support substrate 301 and the silicon active layer 303 to a space (FIG. 6(b)). Thereafter, a conductive film 308 is formed on overall surfaces of the through-holes 304, the through-hole 306, and the SOI substrate through a CVD method and a plating method.

Through the above processes, penetration electrodes 309 forming electric wirings that penetrate through the support substrate 301 and the SOI substrate, and a dielectric isolation structure 310 that electrically isolates a partial area of the support substrate 301 are formed (FIG. 6(c)).

Thereafter, a photoresist is coated on a surface on which the silicon active layer 303 is formed, and a pattern forming the movable portion 105 of the acceleration sensor is transferred through the photolithography.

Then, the silicon active layer 303, the insulating film 307 formed on the surface of the silicon active layer 303, and the conductive film 308 are processed into the pattern of the movable portion 105 through the depth etching technique of the silicon monocrystal. At this time, the insulating oxide film layer 302 remains in a lower portion of the structure of the movable portion 105.

Upon forming the pattern of the movable portion 105, the coated photoresist is removed by ashing. Further, the insulating oxide film layer 302 in the lower portion of the structure of the movable portion 105 is removed through the wet etching technique or the gas phase etching technique. After this process, the structure which is the movable portion 105 of the acceleration sensor is formed on the support substrate 301 (FIG. 7(a)). That is, the movable portion 105 is separated from the support substrate 301.

On the other hand, a space for arranging the acceleration sensor therein is formed in a cap member 311 made of glass, monocrystal silicon, or resin through a chemical or physical etching technique. In this example, the space for arranging the acceleration sensor therein is formed taking a variation of the movable portion 105 assumed by application of the acceleration in the z-direction, and a mounting error thereof into consideration. The cap member 311 is a protective member that prevents water or foreign matter from being mixed into the acceleration sensor.

Then, the support substrate 301 on which the movable portion 105 of the acceleration sensor is formed, and the cap member 311 formed with the space for arranging the acceleration sensor therein are joined together. In this joint, a method using an adhesive is applied when the cap member 311 is made of, for example, resin, and a method (FIG. 7(b)) using an anodic bonding method is applied if the cap member 311 is made of, for example, monocrystal silicon or glass.

Thereafter, the conductive film 308 arranged on the support substrate 301 side of the SOI substrate is processed through the photolithography and the etching technique (FIG. 7(c)). Through this processing, wirings connected to the movable portion 105 and the detection electrode of the acceleration sensor formed in the silicon active layer 303 can be connected to pads 312 and 314 for wire bonding formed on the support substrate 301 side of the SOI substrate through the penetration electrodes 309. Also, through this processing, the lower electrode 119 electrically isolated from the support substrate 301 by the dielectric isolation structure 310 can be electrically connected to the wire bonding pad 313 formed on the support substrate 301 side of the SOI substrate.

With the above processing, the acceleration sensor chip according to the first embodiment can be formed.

<Configuration of Signal Processing Circuit>

Figure 8:
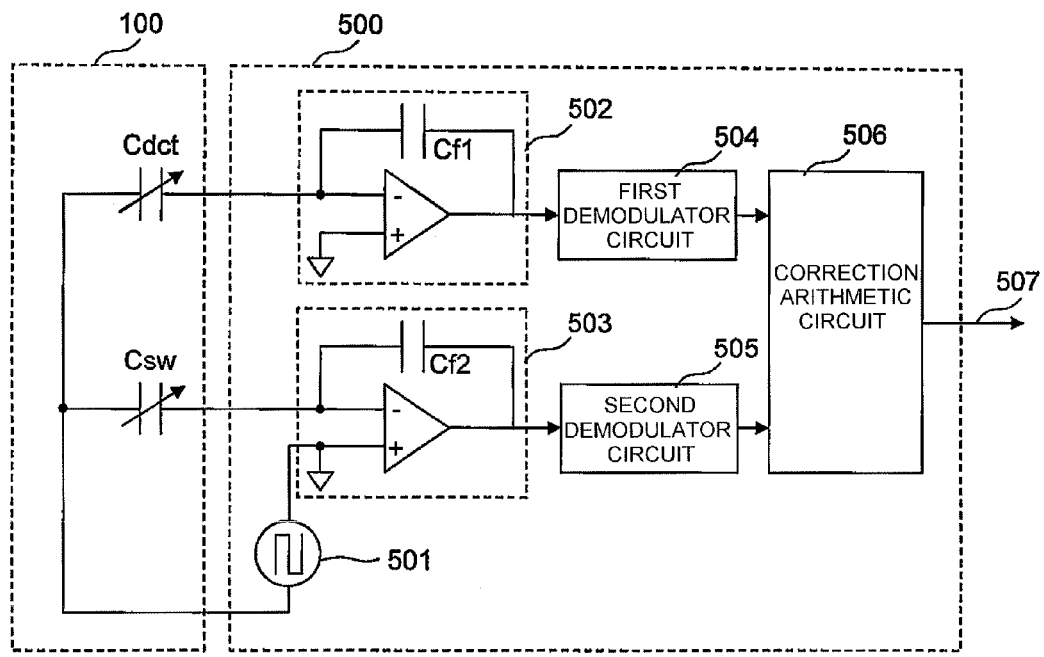
FIG. 8 is a diagram illustrating a configuration of a signal processing circuit in the acceleration sensor chip according to the first embodiment.

Subsequently, a configuration of the acceleration sensor according to the first embodiment will be described from an aspect of a signal processing circuit. FIG. 8 illustrates a functional configuration of the signal processing circuit used in the first embodiment. As illustrated in FIG. 8, the acceleration sensor according to the first embodiment is configured by the sensor chip 100, and a semiconductor chip 500. The sensor chip 100 is formed with an MEMS structure through the above-mentioned manufacturing process, and the semiconductor chip 500 is formed with the signal processing circuit through a general semiconductor process.

As described above, the sensor chip 100 is formed with the displacement detection capacitive element Cdct and the orientation determination capacitive element Csw. On the other hand, the signal processing circuit includes a modulated signal generation unit 501, a first C-V conversion unit 502, a second C-V conversion unit 503, a first demodulator circuit 504, a second demodulator circuit 505, and a correction arithmetic circuit 506.

One of output lines of the modulated signal generation unit 501 is connected in parallel to one terminal of the displacement detection capacitive element Cdct, and one end of the orientation determination capacitive element Csw. In this example, the modulated signal generation unit 501 generates a modulated signal (carrier wave) of, for example, several hundreds kHz. The modulated signal is applied with a bias voltage. The bias voltage provides a center voltage of the modulated signal (carrier wave). The modulated signal superimposed on the bias voltage is applied to the movable portion 105 through the displacement detection capacitive element Cdct and the orientation determination capacitive element Csw.

The frequency of the modulated signal is normally several hundreds kHz. This frequency is very high as compared with a natural frequency of the MEMS structure. For that reason, it can be assumed that there is no change in the capacitance of the displacement detection capacitive element Cdct and the orientation determination capacitive element Csw due to the modulated signal.

In this state, when the acceleration is applied from the external, the movable portion 105 is displaced from the initial position, the capacitances of the displacement detection capacitive element Cdct and the orientation determination capacitive element Csw are each changed. The change in the capacitance causes a change in an external response frequency (DC to several tens Hz) corresponding to the acceleration applied from the external. The movable portion 105 is always applied with the modulated signal generated in the modulated signal generation unit 501. Therefore, the change in the capacitance of the external response frequency (DC to several tens Hz) appears in a state where the change in the capacitance is superimposed on a carrier wave frequency (several hundreds kHz).

As described above, the semiconductor chip 500 includes the first C-V conversion unit 502, the second C-V conversion unit 503, the first demodulator circuit 504, the second demodulator circuit 505, and the correction arithmetic circuit 506. Each of the demodulator circuits 504 and 505 includes an A/D conversion unit and a synchronous detector circuit.

The first C-V conversion unit 502 includes an operational amplifier that converts the change in the capacitance of the displacement detection capacitive element Cdct into a voltage signal, and a reference capacitor Cf1, and converts the change in the capacitance of the displacement detection capacitive element Cdct into the voltage signal. In this example, the displacement detection capacitive element Cdct, the reference capacitor Cf1 and the operational amplifier configure a negative feedback amplifier circuit. Two input potentials of the operational amplifier have a relationship of a virtual ground. Therefore, the center voltage (that is, bias voltage) appearing across an inverting input terminal thereof matches a voltage across a non-inverting input terminal thereof. A voltage signal output from the first C-V conversion unit 502 is input to an A/D conversion unit within the first demodulator circuit 504, and converted into a digital signal.

The voltage signal that has been converted into the digital signal is input to the synchronous detection unit within the first demodulator circuit 504, and conducts synchronous detection with the use of a frequency and a phase of the modulated signal generated in the modulated signal generation unit 501. That is, the voltage signal of the external response frequency (DC to several tens Hz) is restored from the digital voltage signal of the displacement detection capacitive element Cdct in which the voltage signal of the external response frequency (DC to several tens Hz) is superimposed on the carrier frequency (several hundreds kHz).

On the other hand, the second C-V conversion unit 503 includes an operational amplifier that converts the change in the capacitance of the orientation determination capacitive element Csw into a voltage signal, and a reference capacitor Cf2, and converts the change in the capacitance of the orientation determination capacitive element Csw into the voltage signal. Likewise, the orientation determination capacitive element Csw, the reference capacitor Cf2, and the operational amplifier configure a negative feedback amplifier circuit. Two input potentials of the operational amplifier have a relationship of a virtual ground. Therefore, even in this case, the center voltage (that is, bias voltage) appearing across the inverting input terminal thereof matches the voltage across the non-inverting input terminal thereof. A voltage signal output from the second C-V conversion unit 503 is input to an A/D conversion unit within the second demodulator circuit 505, and converted into a digital signal. The voltage signal that has been converted into the digital signal is input to the synchronous detection unit within the second demodulator circuit 505, and implements synchronous detection with the use of a frequency and a phase of the modulated signal generated in the modulated signal generation unit 501. That is, the voltage signal of the external response frequency (DC to several tens Hz) is restored from the digital voltage signal of the orientation determination capacitive element Csw in which the voltage signal of the external response frequency (DC to several tens Hz) is superimposed on the carrier frequency (several hundreds kHz).

Then, the digital voltage signal of the displacement detection capacitive element Cdct corresponding to the amount of displacement of the movable portion 105 is input to the correction arithmetic circuit 506. The digital voltage signal is converted into the magnitude of the acceleration input to the acceleration sensor in the correction arithmetic circuit 506. Also, the correction arithmetic circuit 506 receives the digital voltage signal of the orientation determination capacitive element Csw for determining the direction of the displacement of the movable portion 105. After the digital voltage signal has determined the direction (positive or negative) of the displacement of the movable portion 105, the digital voltage signal converts the direction of the acceleration input to the acceleration sensor into a code indicative of positive, negative, or null. The correction arithmetic circuit 506 calculates the combination of the digital signal indicative of the magnitude of the acceleration input to the acceleration sensor with the code indicative of the direction of the acceleration input to the acceleration sensor, and outputs an acceleration signal 507.

Figure 9:
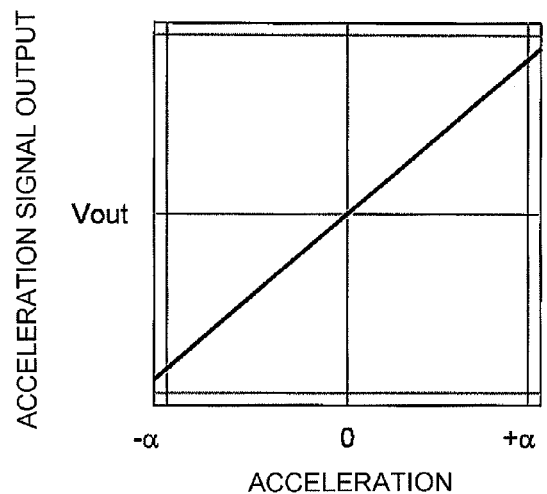
FIG. 9 is a diagram illustrating an input/output characteristic of the acceleration sensor according to the first embodiment.

An input/output characteristic when the output signal is a voltage is illustrated in FIG. 9. The axis of abscissa represents an acceleration vector, and the axis of ordinate is an output value of the acceleration signal. Because of a vector volume, information on the direction and the absolute value is stored. As illustrated in FIG. 9, a linear relationship is established between the acceleration signal output and the acceleration vector.

<Mounting Structure>

Subsequently, a method of mounting the acceleration sensor according to the first embodiment will be described. FIG. 10 illustrates a cross-sectional view corresponding to a mounting configuration example of the acceleration sensor according to the first embodiment. As illustrated in FIG. 10, the semiconductor chip 500 is mounted on a depressed bottom portion of a package member 701. The package member 701 is made of, for example, ceramics. An integrated circuit including a transistor and a passive element is formed on the semiconductor chip 500. The integrated circuit formed on the semiconductor chip 500 has a function of processing the output signal from the sensor chip 100, and finally outputs an acceleration signal.

The sensor chip 100 is mounted over the semiconductor chip 500 through the cap member 311. As described above, the MEMS structure configuring the acceleration sensor is formed on the sensor chip 100. A pad 702 formed on the sensor chip 100, and a pad 703 formed on the semiconductor chip 500 are connected to each other by, for example, a metal wire 704. Further, a pad 705 formed on the semiconductor chip 500 is connected to a terminal 706 formed on the package member 701 by a metal wire 707, and electrically connected to a terminal 708 connected to an external of the package member 701 through an internal wire of the package member 701. Also, the semiconductor chip 500 and the sensor chip 100, which are laminated within the package member 701, are hermetically sealed within the package member 701 by sealing an opening of the package member 701 with a lid 709.

With the above configuration, there can be provided the acceleration sensor that can detect the direction and amount of displacement of the movable electrode in the thickness direction of the support substrate, that is, the direction and magnitude of the applied dynamic quantity without warping the movable electrode in the direction of separating from the support substrate even in a state where the physical quantity is not applied to the acceleration sensor. That is, there can be provided the sensor high in the yield and low in the manufacturing costs without being affected by a processing precision because there is no need to warp the movable electrode in the direction of separating from the support substrate even in the state where the physical quantity is not applied to the sensor. Also, there can be provided the sensor that can ensure a wider operating range of the movable portion without a need to apply the voltage between the movable portion and the support substrate, and more improve an S/N ratio because there is no need to warp the movable electrode in the direction of separating from the support substrate even in the state where the physical quantity is not applied to the sensor.

Second Embodiment

In this embodiment, a case in which the physical quantity detection sensor is an angular velocity sensor will be described. First, a basic configuration of the angular velocity sensor according to this embodiment will be described.

<Sensor Configuration and Configuration of Upper Surface>

Figure 11:
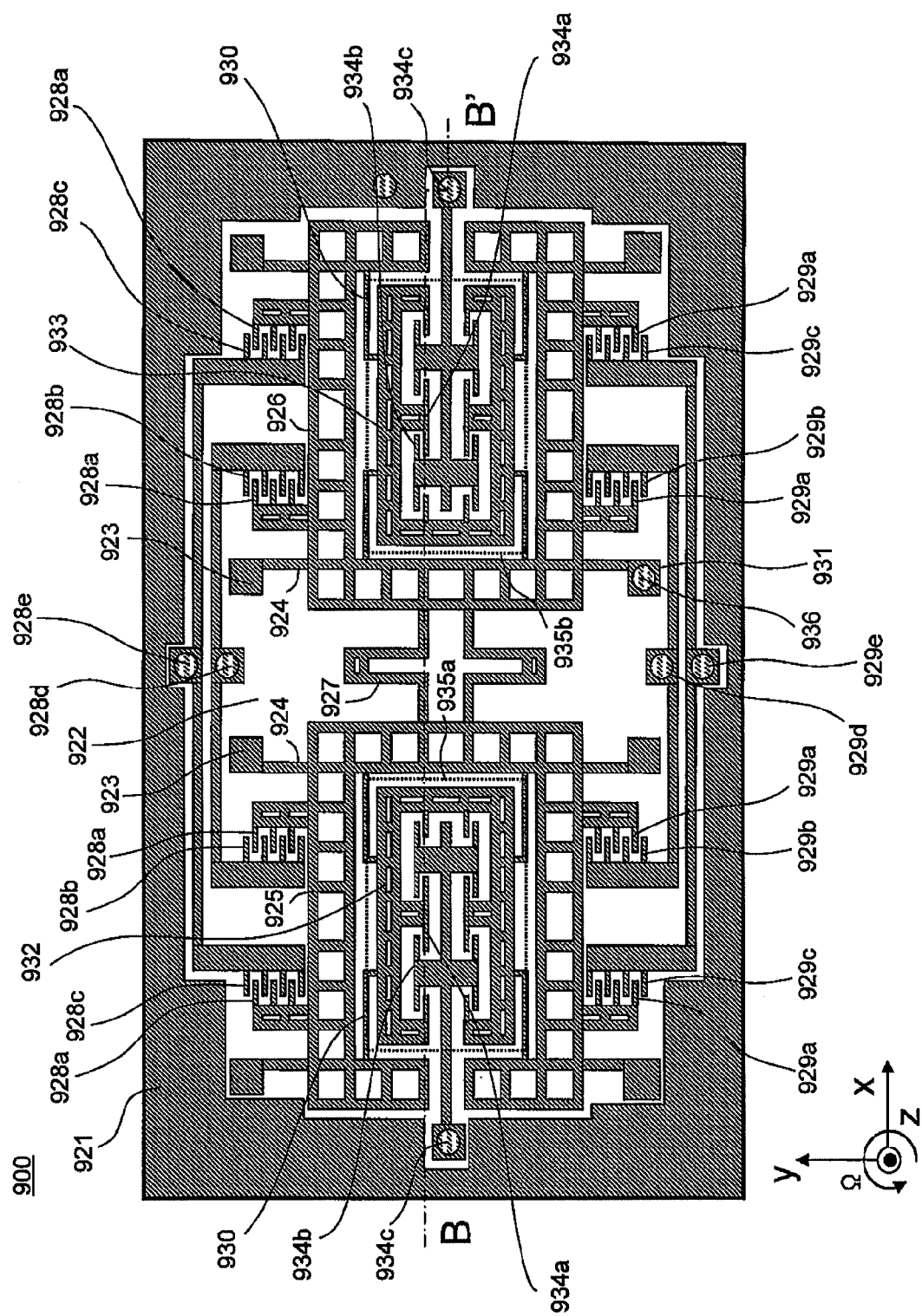
FIG. 11 is a diagram illustrating an upper surface structure of an angular velocity sensor chip according to a second embodiment.

FIG. 11 is a top view illustrating a structure configuring the angular velocity sensor formed on a sensor chip 900.

As illustrated in FIG. 11, a hollow portion 922 is formed in an inside portion of a frame portion 921 of the sensor chip 900. Two sets of angular velocity sensors are arranged inside of the hollow portion 922. In this embodiment, the two sets of angular velocity sensors are arranged for the purpose of improving a detection precision. If only the angular velocity is detected, only one set of angular velocity sensor may be arranged inside of the hollow portion 922. Hereinafter, a case in which two sets of angular velocity sensors are arranged inside of the hollow portion 922 will be continuously described.

In this embodiment, eight fixed portions 923 are arranged in the hollow portion 922. Four fixed portions 923 are arranged for one set of angular velocity sensor. The eight fixed portions 923 are connected to eight beams 924 elastically deformed one-on-one. The other end sides of the four beams 924 are connected to respective movable portions 925 and 926 which are weights of the angular velocity sensors.

The angular velocity sensor according to this embodiment has two excitation elements configured by the movable portions 925 and 926. The respective movable portions 925 and 926 which form the excitation elements can be displaced in the X-direction in FIG. 11. Also, those two movable portions 925 and 926 both forming the excitation elements are connected to each other through link beams 927. The link beams 927 function as a tuning fork vibration system that share the respective vibration energies.

One side of the movable portion 925 forming the excitation element, which is parallel to the X-direction, is formed with two pectinate drive movable electrodes 928a integrated with the movable portion 925. Likewise, one side of the movable portion 926 forming the excitation element which is parallel to the X-direction is formed with two pectinate drive movable electrodes 928a integrated with the movable portion 926. Drive fixed electrodes 928b and 928c are formed within the hollow portion 922 so as to form pectinate capacitances in cooperation with those two drive movable electrodes 928a. That is, the pectinate electrodes of the drive movable electrodes 928a, and the respective pectinate electrodes of the drive fixed electrodes 928b and 928c are alternately arranged.

A periodic drive signal represented by Vcom+Vb+Vd is applied between the drive movable electrodes 928a and the drive fixed electrode 928b which alternately face each other. Likewise, a periodic drive signal represented by Vcom+Vb−Vd is applied between the drive movable electrodes 928a and the drive fixed electrode 928c which alternately face each other.

Vcom is applied to the movable portions 925 and 926 which are the excitation elements through a common electrode 931. For that reason, an electrostatic force is exerted between the drive movable electrodes 928a and the drive fixed electrode 928b, or between the drive movable electrodes 928a and the drive fixed electrode 928c, to vibrate the drive movable electrodes 928a.

In this example, when the drive movable electrodes 928a vibrate in the X-direction, the movable portions 925 and 926 integrated with the drive movable electrodes 928a vibrate in reverse phase. That is, a capacitive element configured by the drive movable electrodes 928a and the drive fixed electrode 928b, and a capacitive element configured by the drive movable electrodes 928a and the drive fixed electrode 928c each function as a forced vibration generation unit that forcedly vibrate the movable portions 925 and 926, which are the excitation elements, in reverse phase with respect to the X-direction.

Also, the other side of the movable portion 925 forming the excitation element, which is parallel to the X-direction, is formed with two drive amplitude monitor movable electrodes 928a integrated with the movable portion 925. Likewise, the other side of the movable portion 926 forming the excitation element, which is parallel to the X-direction, is formed with two drive amplitude monitor movable electrodes 929a integrated with the movable portion 925. Drive amplitude monitor fixed electrodes 929b and 929c are formed within the hollow portion 922 so as to form pectinate capacitances in cooperation with those two drive amplitude monitor movable electrodes 928a. That is, the pectinate electrodes of the drive amplitude monitor movable electrodes 928a, and the respective pectinate electrodes of the drive amplitude monitor fixed electrodes 929b and 929c are alternately arranged.

In this example, when the movable portions 925 and 926, which are the excitation elements, are displaced in the X-direction due to the electrostatic force exerted between the drive movable electrodes 928a and the drive fixed electrode 928b, or between the drive movable electrodes 928a and the drive fixed electrode 928c, the capacitances of the above-mentioned two capacitive elements are changed. That is, a capacitance configured by the drive amplitude monitor movable electrodes 929a and the drive amplitude monitor fixed electrode 929b, and a capacitive element configured by the drive amplitude monitor movable electrodes 929a and the drive amplitude monitor fixed electrode 929b each function as a capacitance detection unit that detects each displacement of the movable portions 925 and 926 which are the excitation elements in the X-direction as a change in the capacitance.

Also, the movable portions 925 and 926 which are the excitation elements each include a hollow portion further inside, and have a configuration to be connected with movable portions 932 and 933 that function as detection elements through beams 930 within the hollow portion. That is, each of those two movable portions 932 and 933 is configured by a pattern portion which functions as a weight, and a protruding portion that forms an angular velocity detection movable electrode 934a. In this configuration, an angular velocity detection movable electrode 934b is formed to face the angular velocity detection fixed electrode 934a so as to be flush therewith. The angular velocity detection movable electrode 934a and the angular velocity detection fixed electrode 934b each form a detection capacitive element (first electrostatic capacitance).

Also, an angular velocity detection fixed electrode 935a is formed between the frame portion 921 and the support substrate facing the frame portion 921 in a Z-direction so as to face the movable portion 932 which is the detection element. Likewise, an angular velocity detection fixed electrode 935b is formed between the frame portion 921 and the support substrate facing the frame portion 921 in the Z-direction so as to face the movable portion 933 which is the detection element. That is, the movable portions 932 and 933 which are the detection elements, and the angular velocity detection fixed electrode 935a and 935b form the respective orientation determination capacitive elements (second electrostatic capacitances).

Referring to FIG. 11, when an angular velocity is applied around the y-axis, the respective movable portions 932 and 933 which are the detection elements are displaced in the z-direction due to a Coriolis force corresponding to the angular velocity, and the respective capacitances of the above-mentioned detection capacitive element and the orientation determination capacitive elements are changed. That is, the detection capacitive element (first electrostatic capacitance) formed of the angular velocity detection movable electrode 934a and the angular velocity detection fixed electrode 934b, the orientation determination capacitive element (second electrostatic capacitance) formed of the movable portion 932 and the angular velocity detection fixed electrode 935a, and the orientation determination capacitive element (second electrostatic capacitance) formed of the movable portion 933 and the angular velocity detection fixed electrode 935b each function as a capacitance detection unit that detects the displacements of the movable portions 932 and 933 which are the detection elements in the z-direction as a change in the capacitance.

Also, a change in the capacitance generated in each pair of electrodes is electrically connected to pads on the rear surface of the sensor chip 900 through penetration electrodes 928d, 928e, 929d, 929e, 936, and 934c, and connected to an integrated circuit having a function of processing the output signal from the angular velocity sensor detection unit by wire bonding.

<Sensor Configuration and Cross-Section>

Figure 12:
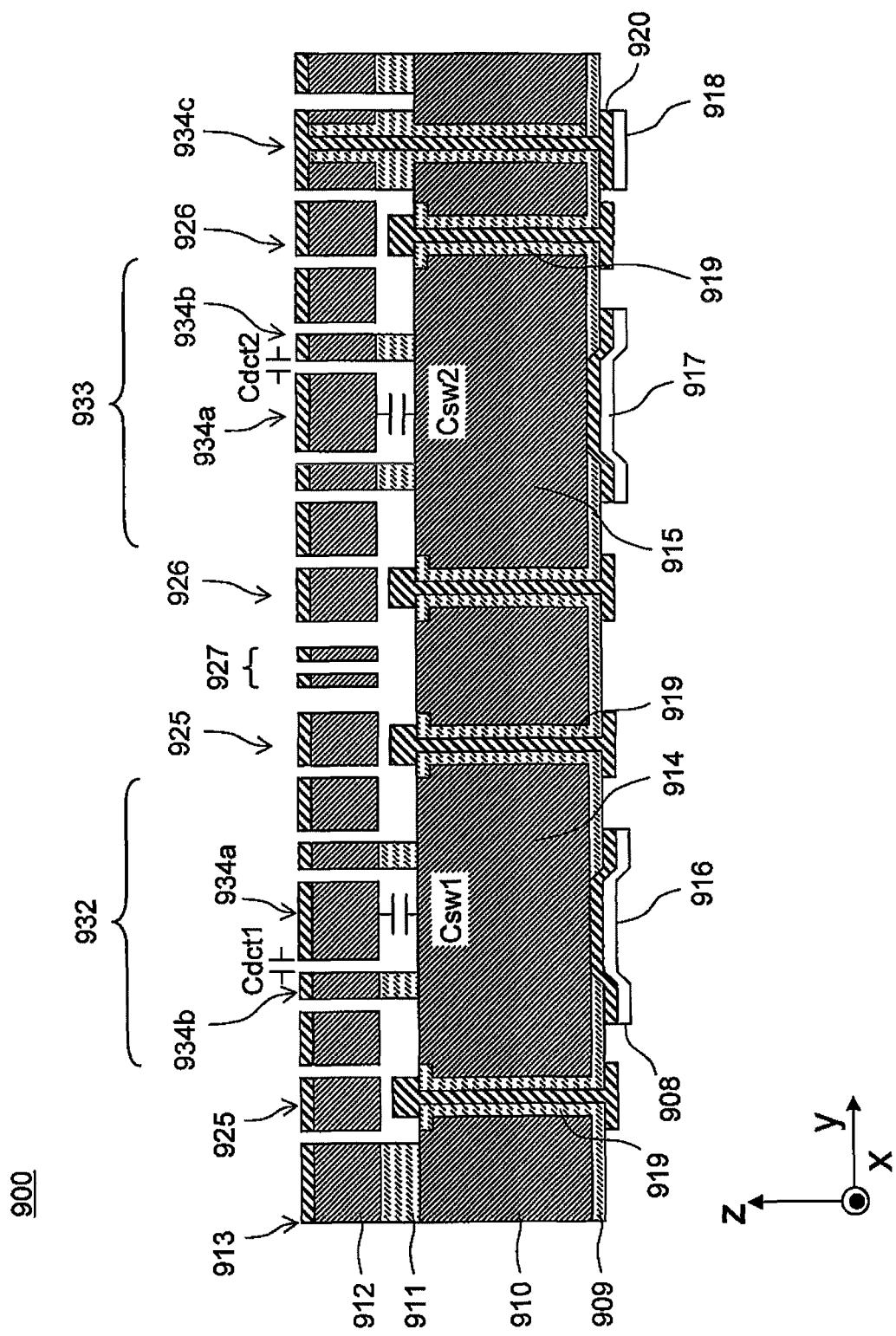
FIG. 12 is a diagram illustrating a cross-sectional structure of the angular velocity sensor chip according to the second embodiment.

FIG. 12 is a cross-sectional view of the sensor chip 900 taken along a line B-B' of FIG. 11. As illustrated in FIG. 12, the sensor chip 900 has a configuration in which an insulating oxide film layer 911 is formed on a support substrate 910, and a silicon active layer 912 is formed further on an upper surface of the insulating oxide film layer 911. That is, the sensor chip 900 configuring the angular velocity sensor in the second embodiment is configured by the SOI (silicon on insulator) substrate.

Further, a conductive film 913 is formed on a surface of the silicon active layer 912. That is, the movable portion 925, the movable portion 932, the angular velocity detection movable electrode 934a formed integrally with the movable portion 932, the angular velocity detection fixed electrode 934b, the link beams 927, the movable portion 926, the movable portion 933, the angular velocity detection movable electrode 934a formed integrally with the movable portion 933, the angular velocity detection fixed electrode 934b, and the fixed portions 923, the beams 924, and the beams 930 which are not illustrated in FIG. 12, are formed integrally by processing the silicon active layer of the SOI substrate, and the conductive film 913 formed on the surface of the SOI substrate.

For example, referring to FIG. 12, it is found that the angular velocity detection fixed electrode 934b is formed over the insulating oxide film layer 911, and fixed to the support substrate 910. On the other hand, for example, the movable portion 932, and the angular velocity detection movable electrode 934a formed integrally with the movable portion 932 are formed of the silicon active layer and the conductive film 913 formed on the surface of the silicon active layer. The insulating oxide film layer 911 formed in a lower layer of the movable portion 932 is removed.

Likewise, an insulating oxide film layer formed in a lower layer of the beams 930 not illustrated in FIG. 12 is also removed. Therefore, the movable portion 932 is arranged in the hollow, and also supported by the beams 930. From this configuration, the movable portion 932 is not completely fixed to the support substrate 910, and formed to be displaceable.

Also, referring to FIG. 12, it is found that a displacement detection capacitive element Cdct1 that detects the displacement of the movable portion 932 which is the detection elements in the z-direction is configured by a conductive layer in which the silicon active layer 912 and the conductive film 913 of the angular velocity detection movable electrode 934a and the angular velocity detection fixed electrode 934b which are formed integrally with the movable portion 932 are integrated together.

Also, it is found that an orientation determination capacitive element Csw1 that detects the displacement of the movable portion 932 which is the detection elements in the z-direction as a change in the capacitance is configured by the conductive layer in which the silicon active layer 912 and the conductive film 913 of the movable portion 932 are integrated together, and a lower electrode 914 formed in the support substrate 910. The lower electrode 914 is electrically isolated from the other regions of the support substrate 910 by a dielectric isolation structure 919 formed in the support substrate 910. Hence, a potential can be applied to the lower electrode 914 through a rear surface pad 916 configured by a conductive film 920 and a conductive film 908.

Also, referring to FIG. 12, it is found that a displacement detection capacitive element Cdct2 that detects the displacement of the movable portion 933 which is the detection elements in the z-direction as a change in the capacitance is formed of a conductive layer in which the silicon active layer 912 and the conductive film 913 of the angular velocity detection movable electrode 934a and the angular velocity detection fixed electrode 934b which are formed integrally with the movable portion 933 are integrated together.

Also, it is found that an orientation determination capacitive element Csw2 that detects the displacement of the movable portion 932 which is the detection elements in the z-direction as a change in the capacitance is configured by the conductive layer in which the silicon active layer 912 and the conductive film 913 of the movable portion 933 are integrated together, and a lower electrode area 915 formed in the support substrate 910.

The lower electrode 915 is electrically isolated from the other regions of the support substrate 910 by the dielectric isolation structure 919 formed in the support substrate 910. Hence, a potential can be applied to the lower electrode 914 through a rear surface pad 917 configured by the conductive film 920 and the conductive film 908.

<Sensor Operation>

Subsequently, a description will be given of a basic operating principle of the angular velocity sensor according to the second embodiment. In the following description, positions at which the movable portions 932 and 933 are located in a state the angular velocity is not applied around the y-axis called "initial positions".

Figure 13:
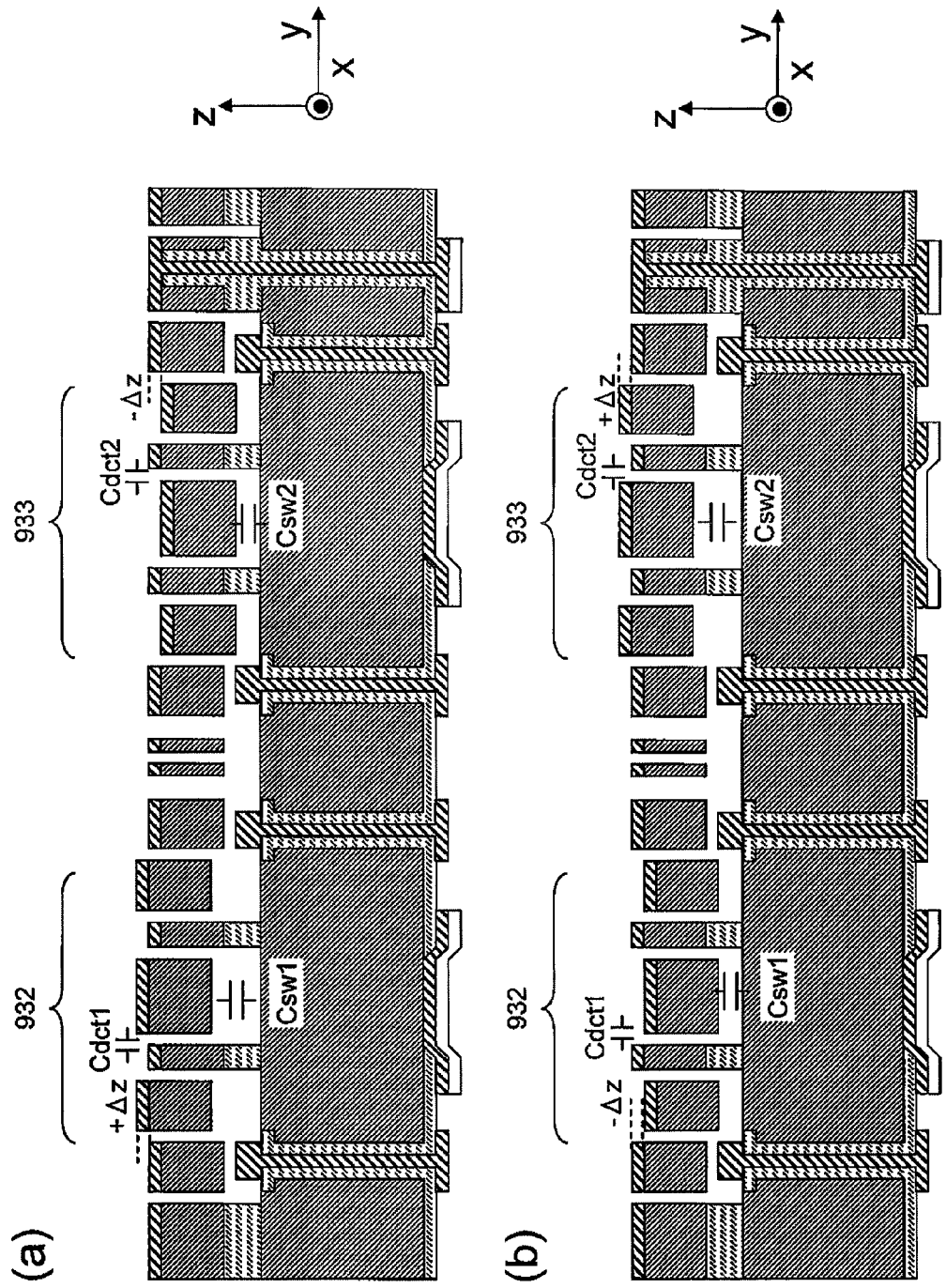
FIG. 13 is a diagram illustrating a cross-sectional structure of the angular velocity sensor chip according to the second embodiment.

FIG. 13 is a cross-sectional view taken along a line B-B' of FIG. 11, which is a cross-sectional view in a state where the angular velocity is applied to a sensor chip from the external.

FIG. 13(a) illustrates a case in which the movable portion 932 is displaced from the initial position in the direction (+Δz direction) of separating from the support substrate 910 with respect to the z-direction by the angular velocity clockwise about the y-axis which is supplied from the external. In this case, the capacitance of the above-mentioned displacement detection capacitive element Cdct1 is decreased. At the same time, the other movable portion 933 is displaced from the initial position in the direction (-Δz direction) of approaching the support substrate 910 with respect to the z-direction by the angular velocity clockwise about the y-axis which is supplied from the external. In this case, the capacitance of the displacement detection capacitive element Cdct2 is decreased.

On the other hand, FIG. 13(b) illustrates a case in which the movable portion 932 is displaced from the initial position in the direction (-Δz direction) of approaching the support substrate 910 with respect to the z-direction by the angular velocity counterclockwise about the y-axis which is supplied from the external. In this case, the capacitance of the above-mentioned displacement detection capacitive element Cdct1 is decreased. At the same time, the other movable portion 933 is displaced from the initial position in the direction (+Δz direction) of separating from the support substrate 910 with respect to the z-direction by the angular velocity counterclockwise about the y-axis which is supplied from the external. In this case, the capacitance of the displacement detection capacitive element Cdct2 is decreased.

That is, the displacement detection capacitive element Cdct1 and the displacement detection capacitive element Cdct2 function as the capacitance detection unit that detects the amount of displacements of the movable portion 932 and the movable portion 933 in the z-direction as the changes in the capacitance.

Also, as illustrated in FIG. 13(a), when the movable portion 932 is displaced from the initial position in the direction (+Δz direction) of separating from the support substrate 910 with respect to the z-direction by the angular velocity clockwise about the y-axis which is supplied from the external, the capacitance of the above-mentioned orientation determination capacitive element Csw1 is decreased. At the same time, when the movable portion 933 is displaced from the initial position in the direction (-Δz direction) of approaching the support substrate 910 with respect to the z-direction by the angular velocity clockwise about the y-axis which is supplied from the external, the capacitance of the orientation determination capacitive element Csw2 is increased.

On the other hand, as illustrated in FIG. 13(b), when the movable portion 932 is displaced from the initial position in the direction (−Δz direction) of approaching the support substrate 910 with respect to the z-direction by the angular velocity counterclockwise about the y-axis which is supplied from the external, the capacitance of the orientation determination capacitive element Csw1 is increased. At the same time, when the movable portion 933 is displaced from the initial position in the direction (+Δz direction) of separating from the support substrate 910 with respect to the z-direction by the angular velocity counterclockwise about the y-axis which is supplied from the external, the capacitance of the orientation determination capacitive element Csw2 is decreased. That is, the orientation determination capacitive element Csw1 and the orientation determination capacitive element Csw2 function as the capacitance detection units that detect the direction of displacements of the movable portion 932 and the movable portion 933 in the z-direction as the changes in the capacitance.

<Change in Capacitance>

FIG. 14 is a diagram illustrating an output characteristic of the angular velocity sensor chip according to the second embodiment.

As illustrated in FIG. 14(a), when the movable portion is displaced from the initial position in the direction (+Δz direction) of separating from the support substrate 910 with respect to the z-direction by the angular velocity supplied from the external, the capacitances of the displacement detection capacitive element Cdct1 and the displacement detection capacitive element Cdct2 are decreased.

Also, even when the movable portion is displaced from a initial position in the direction (−Δz direction) of approaching the support substrate with respect to the z-direction by the angular velocity supplied from the external, the capacitances of the displacement detection capacitive element Cdct1 and the displacement detection capacitive element Cdct2 are decreased. That is, the displacement detection capacitive element Cdct1 and the displacement detection capacitive element Cdct2 function as the capacitance detection units that detect the amount of displacement of the movable portion in the z-direction as the changes in the capacitance.

On the other hand, as illustrated in FIG. 14(b), when the movable portion is displaced from the initial position in the direction (+Δz direction) of separating from the support substrate with respect to the z-direction by the angular velocity supplied from the external, the capacitances of the orientation determination capacitive element Csw1 and the orientation determination capacitive element Csw2 are decreased.

Also, when the movable portion is displaced from a initial position in the direction (−Δz direction) of approaching the support substrate with respect to the z-direction by the angular velocity supplied from the external, the capacitances of the orientation determination capacitive element Csw1 and the orientation determination capacitive element Csw2 are increased. That is, the orientation determination capacitive element Csw1 and the orientation determination capacitive element Csw2 function as the capacitance detection units that detect the direction of displacement of the movable portion in the z-direction as the changes in the capacitance.

<Configuration of Signal Processing Circuit>

Figure 15:
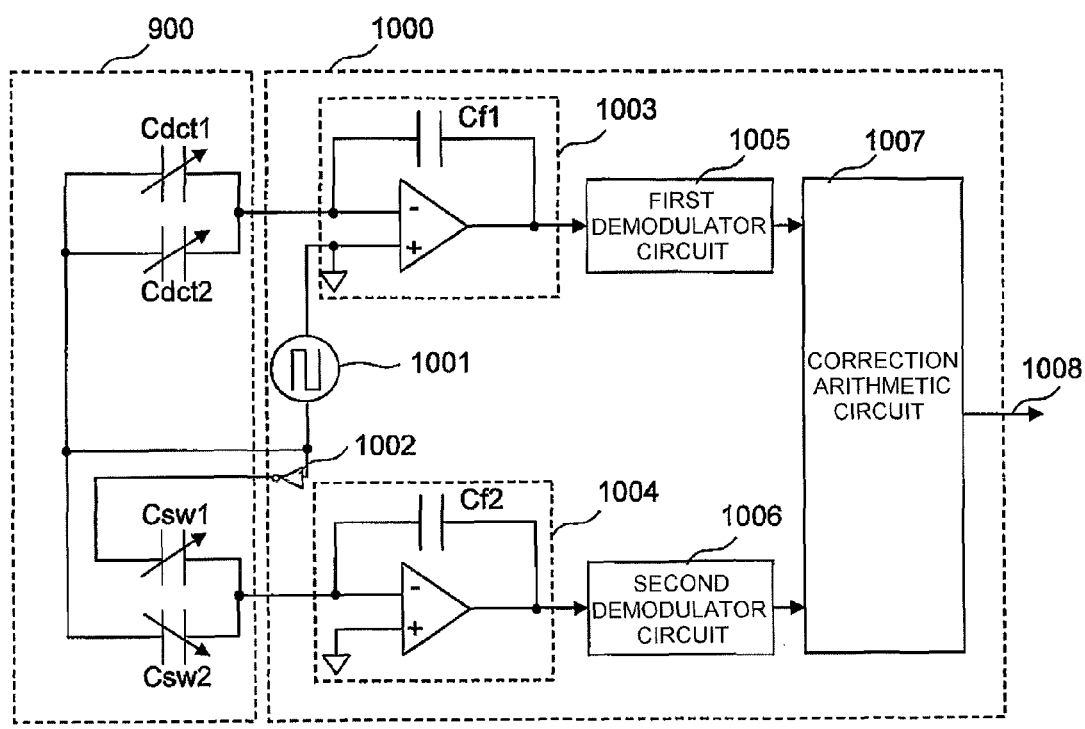
FIG. 15 is a diagram illustrating a detector circuit of the angular velocity sensor chip according to the second embodiment.

Subsequently, a description will be given of a configuration of the signal processing circuit of the angular velocity sensor according to the second embodiment. FIG. 15 illustrates a function configuration of the signal processing circuit of the angular velocity sensor according to the second embodiment. As illustrated in FIG. 15, the angular velocity sensor according to the second embodiment is configured by the sensor chip 900, and a sensor chip 1000. The sensor chip 900 is formed with the MEMS structure through the same procedure as that of the manufacturing process in the first embodiment, and the sensor chip 1000 is formed with the signal processing circuit through the general semiconductor process.

As described above, the sensor chip 1000 is formed with the displacement detection capacitive elements Cdct1, Cdct2, and the orientation determination capacitive element Csw1, Csw2. On the other hand, the signal processing circuit is formed with a modified signal generation unit 1001, an inverter 1002, a first C-V conversion unit 1003, a second C-V conversion unit 1004, a first demodulator circuit 1005, a second demodulator circuit 1006, and a correction arithmetic circuit 1007.

One of output lines of the modulated signal generation unit 1001 is connected in parallel to one terminal of the displacement detection capacitive element Cdct1, one terminal of the displacement detection capacitive element Cdct2, one terminal of the orientation determination capacitive element Csw1, and one terminal of the orientation determination capacitive element Csw2. A modified signal (carrier signal) of the modified signal generation unit 1001 is connected to the orientation determination capacitive element Csw1 through the inverter 1002.

The modified signal generation unit 1001 generates the modified signal (carrier wave). The modified signal generation unit 1001 generates the modified signal of, for example, several hundreds kHz. The modified signal generated by the modified signal generation unit 1001 is applied with a bias voltage, and supplied to the movable portion through the displacement detection capacitive element Cdct1, the displacement detection capacitive element Cdct2, the orientation determination capacitive element Csw1, and the orientation determination capacitive element Csw2. The frequency of the modulated signal is normally several hundreds kHz. This frequency is very high as compared with a natural frequency of the MEMS structure. For that reason, it can be assumed that there is no change in the capacitance of the displacement detection capacitive element Cdct1, the displacement detection capacitive element Cdct2, the orientation determination capacitive element Csw1, and the orientation determination capacitive element Csw2 due to the modulated signal.

In this state, when the angular velocity is applied from the external, the movable portion of the MEMS structure configuring the sensor chip 900 is displaced, and the capacitances of the displacement detection capacitive element Cdct1, the displacement detection capacitive element Cdct2, the orientation determination capacitive element Csw1, and the orientation determination capacitive element Csw2 are changed. The change in the capacitance includes a change in an external response frequency (to several tens Hz) corresponding to the angular velocity applied from the external. The movable portion is always applied with the modulated signal generated in the modulated signal generation unit 1001. Therefore, the change in the capacitance of the external response frequency is superimposed on a carrier wave frequency (several hundreds kHz).

As described above, the sensor chip 1000 includes the first C-V conversion unit 1003, the second C-V conversion unit 1004, the first demodulator circuit 1005, the second demodulator circuit 1006, and the correction arithmetic circuit 1007. Each of the demodulator circuits 1005 and 1006 includes an A/D conversion unit and a synchronous detector circuit.

The first C-V conversion unit 1003 includes an operational amplifier that converts a sum of changes in the capacitance of the displacement detection capacitive element Cdct1 and the displacement detection capacitive element Cdct2 into a voltage signal, and the reference capacitance Cf1. This operational amplifier also functions as an inverting amplifier circuit, and converts a change in the capacitance of the displacement detection capacitive element Cdct1 into a voltage signal, and outputs the voltage signal. The voltage signal output from the first C-V conversion unit 1003 is input to an A/D conversion unit within the first demodulator circuit 1005, and converted into a digital signal. The voltage signal that has been converted into the digital signal is input to a synchronous detection unit within the first demodulator circuit 1005, and implements the synchronous detection with the use of the frequency and the phase of the modulated signal generated by the modified signal generation unit 1001. That is, the voltage signal of the external response frequency (to several tens Hz) is restored from the digital voltage signal of the displacement detection capacitive elements Cdct1+Cdct2 in which the voltage signal of the external response frequency (to several tens Hz) is superimposed on the carrier frequency (several hundreds kHz).

The second C-V conversion unit 1004 includes an operational amplifier that converts a difference in the change of the capacitance between the orientation determination capacitive element Csw1 and the orientation determination capacitive element Csw2 into a voltage signal, and the reference capacitor Cf2. The operational amplifier also functions as an inverting amplifier circuit, and converts the change in the capacitance of the displacement detection capacitive element Cdct2 into a voltage signal, and outputs the voltage signal. The voltage signal inverted in phase by the inverter 1002 is superimposed on the orientation determination capacitive element Csw1. The voltage signal output from the second C-V conversion unit 1004 is input to an A/D conversion unit within the second demodulator circuit 1006, and converted into a digital signal. The voltage signal that has been converted into the digital signal is input to the synchronous detection unit within the second demodulator circuit 1006, and conducts the synchronous detection with the use of the frequency and the phase of the modulated signal generated in the modified signal generation unit 1001. That is, the voltage signal of the external response frequency (to several tens Hz) is restored from the digital voltage signal of the orientation determination capacitive elements Csw1-Csw2 in which the voltage signal of the external response frequency (to several tens Hz) is superimposed on the carrier frequency (several hundreds kHz).

Subsequently, the correction arithmetic circuit 1007 receives the digital voltage signal of the displacement detection capacitive element Cdct1+Cdct2 corresponding to the amount of displacement of the movable portion. In the correction arithmetic circuit 1007, the digital voltage signal is converted into the magnitude of angular velocity input to the angular velocity sensor. Also, the correction arithmetic circuit 1007 receives the digital voltage signal of the orientation determination capacitive element Csw1-Csw2 for determining the displacement direction of the movable portion. After the positive or negative of the direction of displacement of the movable portion has been determined, the digital voltage signal is converted into the code indicative of the positive, negative, or null as the direction of the acceleration input to the sensor. The correction arithmetic circuit 1007 calculates the combination of the digital signal converted into the magnitude of the angular velocity to be input to the angular velocity sensor with the code indicative of the direction of the acceleration to be input to the angular velocity sensor, and outputs an angular velocity signal 1008. Although not shown, a linear relationship is established between the angular velocity signal output and the angular velocity vector.

<Mounting Structure>

Figure 16:
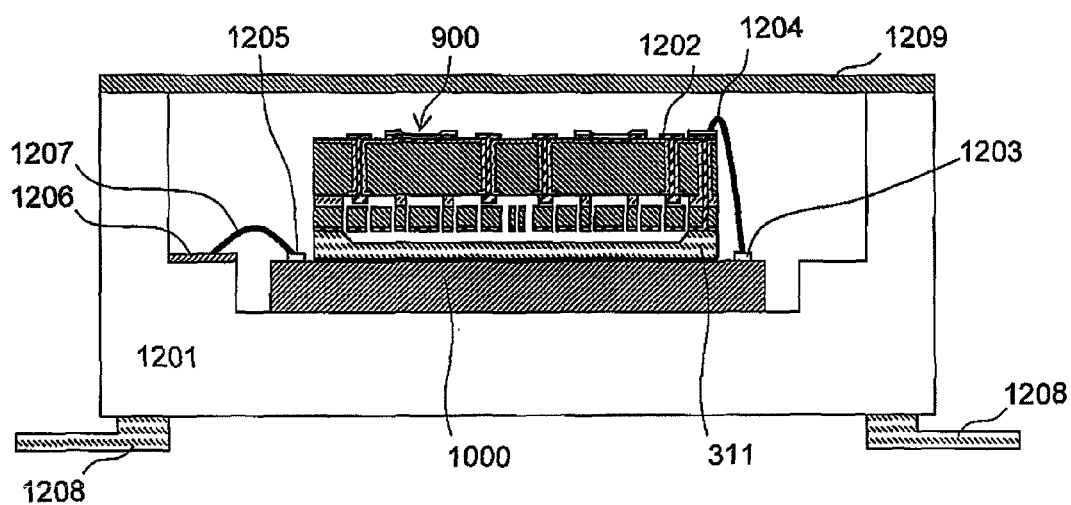
FIG. 16 is a diagram illustrating a cross-sectional structure in which the angular velocity sensor chip is mounted according to the second embodiment.

Subsequently, a method of mounting the angular velocity sensor according to the second embodiment will be described. FIG. 16 illustrates a cross-sectional view corresponding to a mounting configuration example of the angular velocity sensor according to the second embodiment. As illustrated in FIG. 16, the sensor chip 1000 is mounted on a depressed bottom portion of a package member 1201. The package member 1201 is made of, for example, ceramics. An integrated circuit including a transistor and a passive element is formed on the sensor chip 1000. The integrated circuit formed on the sensor chip 1000 has a function of processing the output signal from the sensor chip 900, and finally outputs an angular velocity sensor.

The semiconductor chip 900 is mounted over the sensor chip 1000 through the cap member 311. As described above, the MEMS structure configuring the angular velocity sensor is formed on the sensor chip 900. A pad 1202 formed on the sensor chip 900, and a pad 1203 formed on the sensor chip 1000 are connected to each other by, for example, a metal wire 1204. Further, a pad 1205 formed on the sensor chip 1000 is connected to a terminal 1206 formed on the package member 1201 by a metal wire 1207. One end of the terminal 1206 is electrically connected to a terminal 1208 connected to the external of the package member 1201 through an internal wiring of the package member 1201.

The sensor chip 1000 and the sensor chip 900 are laminated within the package member 1201, and an upper opening of the package member 1201 is sealed with a lid 1209. As a result, the package member 1201 is hermetically sealed.

With the above configuration, even in this embodiment, the same advantageous effects as those in the first embodiment are obtained. Further, when vibration noise is supplied to the overall angular velocity sensor, those two movable portion 932 and movable portion 933 are displaced in the same direction of the z-axis. For that reason, zero is output as the digital voltage signal of the orientation determination capacitive elements Csw1 to Csw2. Therefore, the angular velocity sensor 1008 calculated and output by the correction arithmetic circuit become zero with the results that the angular velocity sensor high in vibration noise resistance can be provided.

Third Embodiment

In this embodiment, a case in which the physical quantity detection sensor is an acceleration sensor will be described. In this embodiment, a description will be given of an example in which a code calculation electrode facing the movable portion is formed on an opposite side (upper side) to the support substrate. Descriptive portions overlapping with those of the first embodiment are omitted, and only the obtained advantageous effects will be described.

<Sensor Configuration and Configuration of Upper Surface>

Figure 17:
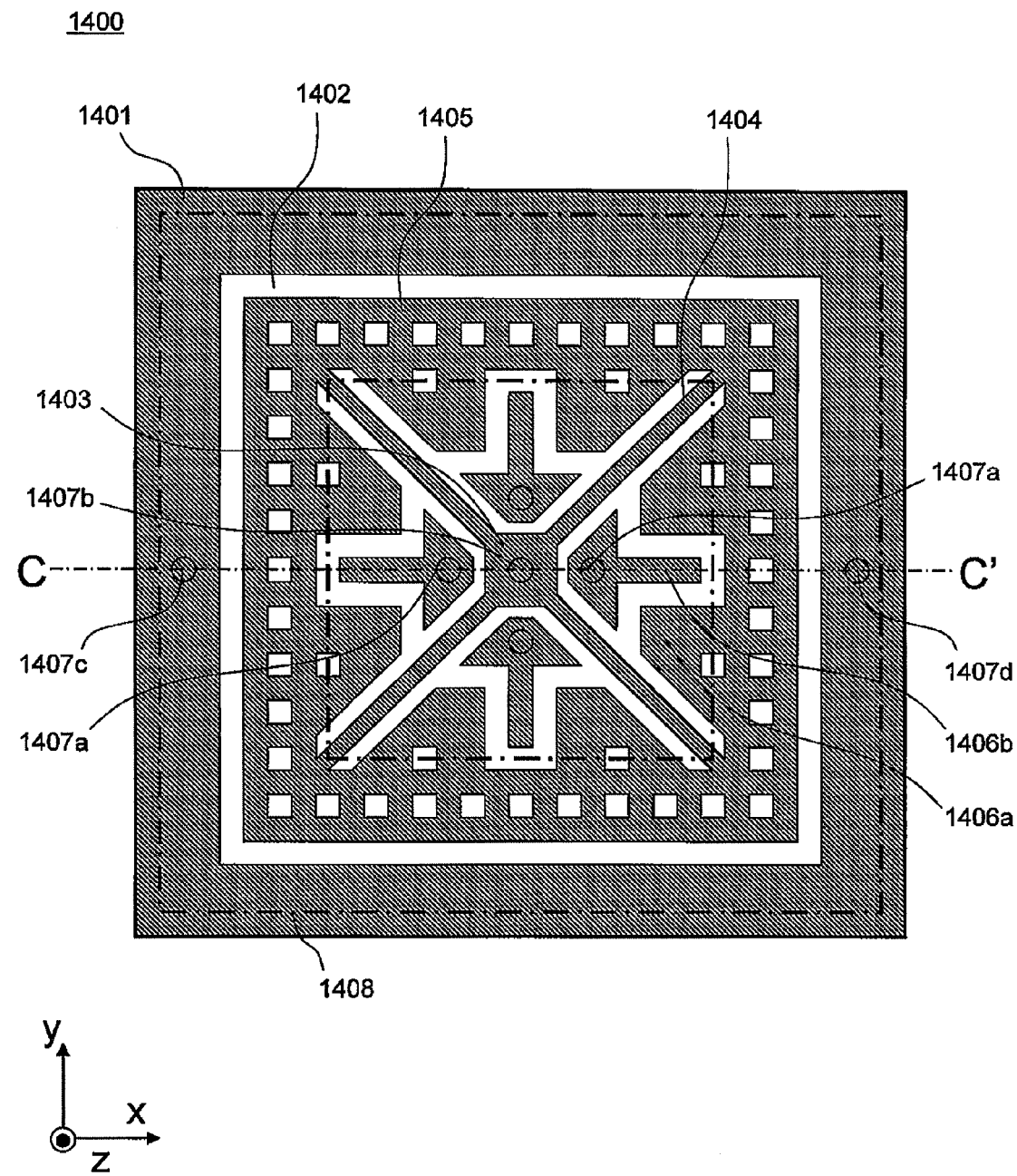
FIG. 17 is a diagram illustrating an upper surface structure of an acceleration sensor chip according to a third embodiment.

FIG. 17 is a top view illustrating a structure configuring the acceleration sensor formed on a sensor chip 1400.

As illustrated in FIG. 17, a fixed portion 1403 is disposed in the center of the sensor chip 1400. Four beams 1404 that are elastically deformed extend in four directions orthogonal to each other from the fixed portion 1403. The other ends of the respective beams 1404 are connected with a movable portion 1405 which is a weight of the acceleration sensor. In the first embodiment, the movable portion 105 is supported by four portions on the outer peripheral side. On the other hand, in the third embodiment, the movable portion 1405 is supported by one portion disposed on a center side thereof. In this way, the fixed portion 1403 and the movable portion 1405 are coupled with each other by four beams 1404 which can be elastically deformed. With this configuration, the movable portion 1405 can be displaced in the z-direction of FIG. 17.

The movable portion 1405 is formed with detection movable electrodes 1406a formed integrally with the movable portion 1405, and detection fixed electrodes 1406b are formed to face the detection movable electrodes 1406a so as to be flush therewith. The detection movable electrodes 1406a and the detection fixed electrodes 1406b each configure a capacitive element (first electrostatic capacitance). When the movable portion 1405 is displaced in the z-direction by the acceleration applied from the external, the capacitance of the above-mentioned capacitive element is changed.

Also, a detection fixed electrode 1408 is formed on a conductive film facing a frame portion 1401 in the z-direction so as to face the movable portion 1405. The movable portion 1405 and the detection fixed electrode 1408 form a capacitive element (second electrostatic capacitance). When the movable portion 1405 is displaced in the z-direction by the acceleration applied from the external, the capacitance of the capacitive element (second electrostatic capacitance) is changed.

The structure of the above acceleration sensor is made of a semiconductor material such as silicon. Therefore, the fixed portion 1403 and the movable portion 1405 which are connected to each other through the beams 1404 are electrically connected to each other. A potential (COM potential) to be applied to the movable portion 1405 is applied from a pad on the substrate rear surface through a penetration electrode 1407b formed in the fixed portion 1403

Also, penetration electrodes 1407a are formed in the detection fixed electrodes 1406b. When the movable portion 1405 is displaced in the z-direction, a change in the capacitance is generated in the capacitive element (second electrostatic capacitance). Thus, when the capacitance is changed, electric charge flows into the detection fixed electrodes 1406b from the pad on the substrate rear surface through the penetration electrodes 1407a, or flows out of the detection fixed electrodes 1406b. The penetration electrodes 1407a are intended for a detection current.

Also, a penetration electrode 1407c is formed in the detection fixed electrode 1408, and configured so that electric charge can flow into the detection fixed electrode 1408 from the pad on the substrate rear surface through the penetration electrode 1407c, or flow out of the detection fixed electrode 1408. The penetration electrode 1407c is intended for a code current. A penetration electrode 1407d is intended for application of a substrate potential (SUB).

<Sensor Configuration and Cross-Section>

Figure 18:
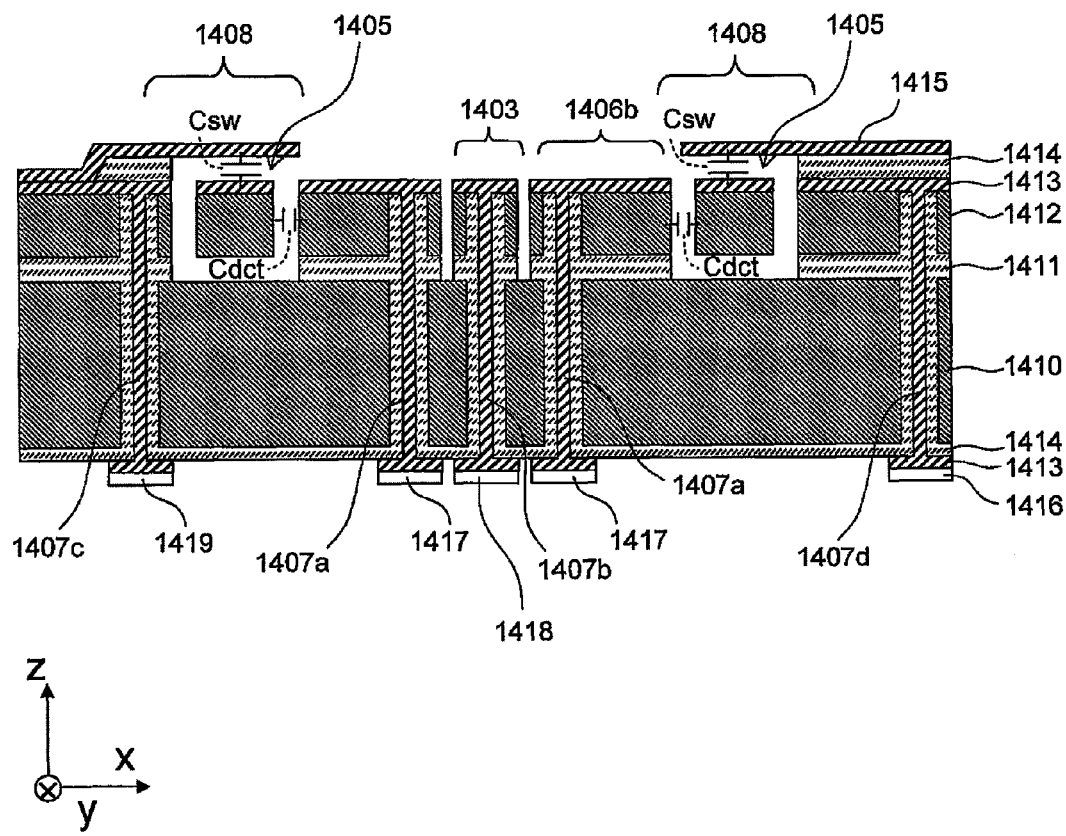
FIG. 18 is a diagram illustrating a cross-sectional structure of the acceleration sensor chip according to the third embodiment.

FIG. 18 is a cross-sectional view of the sensor chip 1400 taken along a line C-C' in FIG. 17. In the third embodiment, the sensor chip 1400 configuring the acceleration sensor is formed of an SOI (silicon on insulator) substrate. Further, a conductive film 1413, an insulating film 1414, and a conductive film 1415 are formed on a surface of a silicon active layer 1412 in order from the lower layer side.

That is, the fixed portion 1403, the movable portion 1405, the detection movable electrodes 1406a (not shown in FIG. 18), the detection fixed electrodes 1406b, and the beams 1404 (not shown in FIG. 18) are formed integrally through processing of the silicon active layer 1412 of the SOI substrate, the conductive film 1413 formed on a surface of the silicon active layer 1412, the insulating film 1414, and the conductive film 1415.

From FIG. 18, it is found that the displacement detection capacitive element Cdct is formed of the detection movable electrodes 1406a formed integrally with the movable portion 1405, the silicon active layer 1412 of the detection fixed electrodes 1406b, and the conductive film 1413.

Also, it is found that the orientation determination capacitive element Csw is formed of the silicon active layer 1412 and the conductive film 1413 in the movable portion 1405, and an upper electrode area of the conductive film 1415 formed on the surface of the conductive film 1413 and the insulating film 1414.

With the above configuration, this embodiment also obtains the same advantageous effects as those in the first embodiment. Further, in the orientation determination capacitive element Csw according to this embodiment, the movable portion 1405 is located in the direction of moving away from the support substrate. For that reason, the capacitance value of the code determination capacitance Csw can be set without depending on the thickness of an insulating oxide layer 1411 of the SOI substrate. Therefore, the initial capacitance value of the orientation determination capacitive element Csw can be reduced while keeping the variation of the orientation determination capacitive element Csw which is generated by the applied physical quantity. For that reason, the detection can be conducted with high sensitivity and high precision.

Other Configuration Examples

The present invention is not limited to the above-mentioned configuration examples, but includes a variety of modified examples. For example, in the above-mentioned embodiments, in order to easily understand the present invention, the specific configurations are described. However, the present invention does not always provide all the configurations described above. Also, a part of one configuration example can be replaced with another configuration example, and the configuration of one embodiment can be added with the configuration of another embodiment. Also, in a part of the respective configuration examples, another configuration can be added, deleted, or replaced.

REFERENCE SIGNS LIST 100, sensor chip
101, frame portion
102, hollow portion 1
103a, fixed portion
103b, fixed portion
104, beam
105, movable portion
106a, detection movable electrode
106b, detection fixed electrode
107a, penetration electrode
107b, penetration electrode
108a, penetration electrode
108b, penetration electrode 109, hollow portion
110, support substrate
111, insulating oxide film layer
112, silicon active layer
113, insulating film
114, conductive film
115, conductive film
116, rear surface pad
117, rear surface pad
118, rear surface pad
119, lower electrode
120, dielectric isolation structure
301, support substrate
302, insulating oxide film layer
303, silicon active layer
304, through-hole
305, through-hole
306, through-hole
307, insulating film
308, conductive film
309, penetration electrode
310, dielectric isolation structure
311, cap member
312, pad
313, pad
314, pad
500, semiconductor chip
501, modulated signal generation unit
502, C-V conversion unit
503, C-V conversion unit
504, demodulator circuit
505, demodulator circuit
506, correction arithmetic circuit
507, acceleration signal
701, package member
702, pad
703, pad
704, metal wire
705, pad
706, terminal
707, metal wire
708, terminal
709, lid
900, sensor chip
908, conductive film
909, insulating film
910, support substrate
911, insulating oxide film layer
912, silicon active layer
913, conductive layer
914, lower electrode
915, lower electrode
916, rear surface pad
917, rear surface pad
918, rear surface pad
919, dielectric isolation structure
920, conductive film
921, frame portion
922, hollow portion
923, fixed portion
924, beam
925, movable portion
926, movable portion
927, link beam
928a, drive movable electrode
928b, drive fixed electrode
928c, drive fixed electrode
928d, penetration electrode
928e, penetration electrode
929a, drive amplitude monitor movable electrode
929b, drive amplitude monitor fixed electrode
929c, drive amplitude monitor fixed electrode
929d, penetration electrode
929e, penetration electrode
930, beam
931, common electrode
932, movable portion
933, movable portion
934a, angular velocity detection movable electrode
934b, angular velocity detection fixed electrode
934c, penetration electrode
935a, angular velocity detection fixed electrode
935b, angular velocity detection fixed electrode
936, penetration electrode
1000, semiconductor chip
1001, modified signal generation unit
1002, inverter
1003, C-V conversion unit
1004, C-V conversion unit
1005, demodulator circuit
1006, demodulator circuit
1007, correction arithmetic circuit
1008, angular velocity signal
1201, package member
1202, pad
1203, pad
1204, metal wire
1205, pad
1206, terminal
1207, metal wire
1208, terminal
1209, lid
1400, sensor chip
1401, frame portion
1402, hollow portion
1403, fixed portion
1404, beam
1405, movable portion
1406a, detection movable electrode
1406b, detection fixed electrode
1407a, penetration electrode (for detection)
1407b, penetration electrode (for COM)
1407c, penetration electrode (for SW)
1407d, penetration electrode (for SUB)
1408, detection fixed electrode (upper electrode)
1410, support substrate
1411, insulating oxide layer
1412, silicon active layer
1413, insulating film
1414, conductive film
1415, conductive film
1416, rear surface pad
1417, rear surface pad
1418, rear surface pad
1419, rear surface pad

The invention claimed is:

1. A semiconductor physical quantity detection sensor, comprising:
a first electrostatic capacitance that is formed by a movable electrode displaced by application of a physical quantity, and a first fixed electrode formed in a first conductive layer shared with the movable electrode;
a second electrostatic capacitance that is formed by the movable electrode, and a second fixed electrode formed in a second conductive layer different from the first conductive layer and different in a height from a substrate surface from the movable electrode; and an arithmetic circuit, connected to the first and second electrostatic capacitances, that calculates the physical quantity based on a change in the first and second electrostatic capacitances generated when the physical quantity is applied, wherein the change is determined based on an electric signal from the first electrostatic capacitance and an electric signal from the second electrostatic capacitance that are input to the arithmetic circuit.

2. The semiconductor physical quantity detection sensor according to claim 1, wherein the arithmetic circuit calculates an absolute value of a displacement of the movable portion according to a change in the first electrostatic capacitance, and wherein the arithmetic circuit calculates an orientation of the displacement of the movable portion according to a change in the second electrostatic capacitance.

3. The semiconductor physical quantity detection sensor according to claim 1, wherein the electric signal from the first electrostatic capacitance and the electric signal from the second electrostatic capacitance are input to a capacitance change detector of the arithmetic circuit.

4. The semiconductor physical quantity detection sensor according to claim 1, comprising:

a laminated substrate in which a silicon active layer is formed on a support substrate through an insulating oxide layer, wherein the movable electrode and the first fixed electrode are formed in the silicon active layer, and wherein the second fixed electrode is formed in the second conductive layer dielectrically isolated from the movable electrode.

5. The semiconductor physical quantity detection sensor according to claim 4, wherein the second conductive layer is the support substrate.

6. The semiconductor physical quantity detection sensor according to claim 4, wherein the first conductive layer is an electrically conductive layer formed on a surface of the silicon active layer to be dielectrically isolated from the movable electrode.

7. The semiconductor physical quantity detection sensor according to claim 4, wherein the first conductive layer is an electrically conductive layer formed on a surface of a cap member arranged on a surface of the silicon active layer to be dielectrically isolated from the movable electrode.

8. A semiconductor physical quantity detection sensor, comprising:

a first electrostatic capacitance that is formed by a movable electrode displaced by application of a physical quantity, and a first fixed electrode formed in a first conductive layer shared with the movable electrode;

a second electrostatic capacitance that is formed by the movable electrode, and a second fixed electrode formed in a second conductive layer different from the first conductive layer and different in a height from a substrate surface from the movable electrode; and an arithmetic circuit, connected to the first and second electrostatic capacitances, that calculates the physical quantity based on a change in the first and second electrostatic capacitances generated when the physical quantity is applied, wherein the change is determined based on an electric signal from the first electrostatic capacitance and an electric signal from the second electrostatic capacitance are input to the arithmetic circuit, and wherein a same center voltage is applied to the movable electrode and the second fixed electrode.

* * * * *